(12) United States Patent
Naniwa et al.

(10) Patent No.: US 12,040,822 B2
(45) Date of Patent: Jul. 16, 2024

(54) MULTIPLEXER, RADIO FREQUENCY FRONT-END CIRCUIT, AND COMMUNICATION DEVICE

(71) Applicant: Murata Manufacturing Co., Ltd., Kyoto (JP)

(72) Inventors: Yusuke Naniwa, Kyoto (JP); Morio Takeuchi, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 416 days.

(21) Appl. No.: 16/996,064

(22) Filed: Aug. 18, 2020

(65) Prior Publication Data

US 2020/0382146 A1    Dec. 3, 2020

Related U.S. Application Data

(63) Continuation of application No. PCT/JP2019/007484, filed on Feb. 27, 2019.

(30) Foreign Application Priority Data

Mar. 8, 2018    (JP) ................................ 2018-042105

(51) Int. Cl.
     *H04B 1/00*      (2006.01)
     *H04B 1/74*      (2006.01)

(52) U.S. Cl.
     CPC ........... *H04B 1/0057* (2013.01); *H04B 1/006* (2013.01); *H04B 1/745* (2013.01)

(58) Field of Classification Search
     CPC ......... H03H 7/46; H03H 7/463; H03H 7/465; H03H 9/25; H03H 9/46; H04B 1/005;

(Continued)

(56) References Cited

U.S. PATENT DOCUMENTS 5,715,525 A * 2/1998 Tarusawa ................. H04B 1/44
                                                                       455/101
7,327,775 B1 * 2/2008 Gu ........................ H04B 1/707
                                                                       375/130

(Continued)

FOREIGN PATENT DOCUMENTS

JP         2015070368 A      4/2015
JP         2015130699 A      7/2015

(Continued)

OTHER PUBLICATIONS

International Search Report issued in Application No. PCT/JP2019/007484, dated May 7, 2019.

(Continued)

*Primary Examiner* — Young T. Tse
(74) *Attorney, Agent, or Firm* — Pearne & Gordon LLP

(57) ABSTRACT

A multiplexer includes first, second, and third filters with first, second, and third frequency bands different from each other, a first connection point connected to a common terminal, a second connection point connected to one end of the first filter and one end of the second filter, a first switch that switches connection and disconnection between the first and second connection points, a reactance element whose one end is connected to a signal path connecting the second connection point and the first switch, a second switch that switches connection and disconnection between the other end of the reactance element and the first connection point, and a third switch that switches connection and disconnection between one end of the third filter and the first connection point. The first and second frequency bands are adjacent to each other among the first, second, and third frequency bands.

14 Claims, 23 Drawing Sheets

(58) Field of Classification Search
CPC .... H04B 1/0053; H04B 1/0057; H04B 1/006; H04B 1/0067; H04B 1/0092; H04B 1/06; H04B 1/16; H04B 1/1615; H04B 1/745
USPC ....... 375/259, 260, 316, 324, 328, 340, 349; 370/387, 388; 455/338–340
See application file for complete search history.

(56) References Cited

U.S. PATENT DOCUMENTS

| | | | |
|---|---|---|---|
| 9,041,484 B2* | 5/2015 | Burgener | H03H 9/6483 333/101 |
| 2009/0206923 A1* | 8/2009 | Shiobara | H03H 11/04 327/553 |
| 2011/0260806 A1 | 10/2011 | Takeuchi | |
| 2014/0227978 A1 | 8/2014 | Ikeda et al. | |
| 2015/0091652 A1 | 4/2015 | Horiguchi et al. | |
| 2015/0304596 A1* | 10/2015 | Petrovic | H04L 5/08 348/731 |
| 2017/0005385 A1* | 1/2017 | Khlat | H03H 19/002 |
| 2017/0026061 A1 | 1/2017 | Wloczysiak | |
| 2017/0047666 A1* | 2/2017 | Khlat | H03H 7/0115 |
| 2017/0222665 A1* | 8/2017 | Chang | H04B 1/48 |
| 2017/0244432 A1 | 8/2017 | Ranta et al. | |
| 2018/0019509 A1 | 1/2018 | Yasuda et al. | |
| 2018/0019730 A1* | 1/2018 | Takeuchi | H03H 9/02559 |
| 2018/0041174 A1 | 2/2018 | Muto | |
| 2018/0123547 A1* | 5/2018 | Kato | H03H 9/605 |
| 2018/0227006 A1 | 8/2018 | Yasuda | |

FOREIGN PATENT DOCUMENTS

| | | |
|---|---|---|
| JP | 2018026795 A | 2/2018 |
| WO | 2010053131 A1 | 5/2010 |
| WO | 2017073509 A1 | 5/2017 |

OTHER PUBLICATIONS

Written Opinion issued in Application No. PCT/JP2019/007484, dated May 7, 2019.

* cited by examiner

MULTIPLEXER, RADIO FREQUENCY FRONT-END CIRCUIT, AND COMMUNICATION DEVICE

This is a continuation of International Application No. PCT/JP2019/007484 filed on Feb. 27, 2019 which claims priority from Japanese Patent Application No. 2018-042105 filed on Mar. 8, 2018. The contents of these applications are incorporated herein by reference in their entireties.

BACKGROUND

The present disclosure relates to a multiplexer, a radio frequency front-end circuit, and a communication device.

Communication devices represented by recent smartphones support so-called multi-band and multi-mode communication in which communication in a plurality of pass bands (hereinafter, also simply referred to as bands) and communication by a plurality of radio systems are performed by one terminal, and carrier aggregation in which communication is performed by simultaneously using a plurality of bands.

In a communication device corresponding to a plurality of bands, a multiplexer for demultiplexing and multiplexing a plurality of radio frequency signals in different bands is arranged for one antenna. Such a multiplexer includes, for example, a plurality of filters and switches, and connects one or more filters among the plurality of filters in a combination selected by the switches to a common connection point.

For example, U.S. Patent Application Publication No. 2017/0244432 discloses a configuration in which one or more filters selected by switches are connected at a common connection point via a pre-matching circuit for each filter, and a variable matching circuit is further connected to the common connection point.

In a multiplexer according to U.S. Patent Application Publication No. 2017/0244432, the switches switch between connection and disconnection of the same number of signal paths as the number of the filters. Therefore, as the number of filters increases, that is, as the number of signal paths increases, a loss in the switches and a return loss due to parasitic capacitances become larger.

Further, an impedance for each signal path shift to a short-circuit side due to the parasitic capacitance of the switch. Therefore, as more signal paths are connected to the common connection point, mismatching at the common connection point increases. To achieve matching, the impedance need to be more largely adjusted, and a loss in a matching circuit increases.

Further, since the number of variable parameters of the circuit are large, adjustment of matching according to a combination of filters to be selected is likely to be complicated.

BRIEF SUMMARY

The present disclosure provides a multiplexer having a simple configuration and excellent characteristics.

A multiplexer according to an aspect of the present disclosure includes a first filter whose pass band is a first frequency band, a second filter whose pass band is a second frequency band different from the first frequency band, a third filter whose pass band is a third frequency band different from any of the first frequency band and the second frequency band, a first connection point connected to a common terminal, a second connection point to which one end of the first filter and one end of the second filter are connected in common, a first switch configured to switch between connection and disconnection between the first connection point and the second connection point, a reactance element whose one end is connected to a signal path connecting the second connection point and the first switch, a second switch configured to switch between connection and disconnection between the other end of the reactance element and the first connection point, and a third switch configured to switch between connection and disconnection between one end of the third filter and the first connection point, wherein the first frequency band and the second frequency band are adjacent to each other among the first frequency band, the second frequency band, and the third frequency band.

According to this configuration, unlike the configuration in the related art in which connection and disconnection between each of first, second, and third filters and a common terminal are individually switched, connection and disconnection between the second connection point to which the first and second filters are connected and the common terminal and connection and disconnection between the third filter and the connection terminal are switched. Accordingly, the number of signal paths to be selected by the switches is reduced, and thus it is possible to reduce a loss by the switches and a return loss due to parasitic capacitances.

Further, since the first and second filters whose path bands are adjacent to each other are connected to the second connection point, mismatching at the second connection point is less likely to occur. Mismatching that occurs when the first, second and third filters are connected to the first connection point is reduced by using the reactance element.

In this way, according to the configuration described above, the multiplexer having a simple configuration and excellent characteristics can be obtained.

Other features, elements, characteristics and advantages of the present disclosure will become more apparent from the following detailed description of embodiments of the present disclosure with reference to the attached drawings.

DETAILED DESCRIPTION

Hereinafter, embodiments of the present disclosure will be described in detail with reference to the embodiments and drawings. It should be noted that all the embodiments to be described below represent comprehensive or specific examples. The numerical values, shapes, materials, constituent elements, arrangement and connection forms of the constituent elements, and the like illustrated in the following embodiments are mere examples and are not intended to limit the present disclosure.

First Embodiment

A multiplexer according to a first embodiment is a multiplexer that corresponds to carrier aggregation by using three bands and in which one or more filters among three filters whose pass bands are different from each other are connected to a common terminal in a combination selected by switches.

Figure 1:
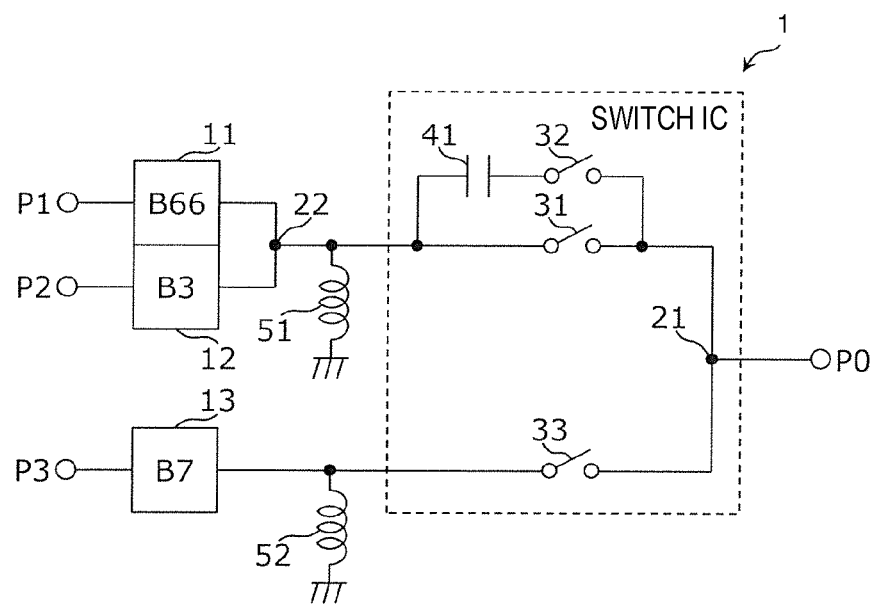
FIG. 1 is a circuit diagram illustrating an example of a configuration of a multiplexer according to a first embodiment.

FIG. 1 is a circuit diagram illustrating an example of a configuration of the multiplexer according to the first embodiment. As illustrated in FIG. 1, a multiplexer 1 includes terminals P0, P1, P2, and P3, filters 11, 12, and 13, connection points 21 and 22, switches 31, 32, and 33, a capacitor 41, and inductors 51 and 52. The switches 31, 32, and 33, and the capacitor 41 may be formed in a switch IC which is a single integrated circuit device.

The filter 11 is a band pass filter whose pass band is a first frequency band. The first frequency band is, as an example, a downlink frequency band of 2110 MHz to 2200 MHz in Band 66 defined by the 3rd Generation Partnership Project (3GPP). Here, the notation of 2110 MHz to 2200 MHz represents a frequency range equal to or higher than 2110 MHz and lower than or equal to 2200 MHz. In the present specification, a frequency range is denoted by a similar notation. The filter 11 may be an acoustic wave filter.

The filter 12 is a band pass filter whose pass band is a second frequency band. The second frequency band is, as an example, a downlink frequency band of 1805 MHz to 1880 MHz in Band 3 defined by 3GPP. The filter 12 may be an acoustic wave filter.

The filter 13 is a band pass filter whose pass band is a third frequency band. The third frequency band is, for example, a downlink frequency band of 2620 MHz to 2690 MHz in Band 7 defined by 3GPP. The filter 13 may be an acoustic wave filter.

The first frequency band and the second frequency band are adjacent to each other among the first frequency band, the second frequency band, and the third frequency band.

One end of the filter 11 is connected to the connection point 22, and the other end thereof is connected to the terminal P1.

One end of the filter 12 is connected to the connection point 22, and the other end thereof is connected to the terminal P2.

The connection point 22 is connected to one end of the switch 31, and the other end of the switch 31 is connected to the connection point 21. The switch 31 switches between connection and disconnection between the connection point 21 and the connection point 22.

One end of the capacitor 41 is connected to a signal path connecting the connection point 22 and the switch 31, and the other end thereof is connected to one end of the switch 32. The other end of the switch 32 is connected to the connection point 21. The switch 32 switches between connection and disconnection between the other end of the capacitor 41 and the connection point 21.

One end of the filter 13 is connected to one end of the switch 33, and the other end thereof is connected to the terminal P3. The other end of the switch 33 is connected to the connection point 21. The switch 33 switches between connection and disconnection between one end of the filter 13 and the connection point 21.

The connection point 21 is connected to the terminal P0.

The inductors 51 and 52 are phase circuits for adjusting impedances at one end of the connection point 22 and one end of the filter 13, respectively. One end of the inductor 51 is connected to the signal path connecting the connection point 22 and the switch 31, and the other end thereof is connected to a ground electrode. One end of the inductor 52 is connected to a signal path connecting the filter 13 and the switch 33, and the other end thereof is connected to a ground electrode. The inductors 51 and 52 may be omitted.

Here, the filters 11, 12, and 13 are examples of first, second, and third filters, respectively. The connection points 21 and 22 are examples of a first connection point and a second connection point, respectively. The switches 31, 32, and 33 are examples of first, second, and third switches, respectively. The capacitor 41 is a reactance element, and is an example of a first capacitor. The terminal P0 is an example of a common terminal.

Next, a usage example of the multiplexer 1 will be described. In the following description, Band 66, Band 3, and Band 7 are an example of a band group that may be simultaneously used in carrier aggregation.

In a usage example 1, normal communication using Band 66 or Band 3 alone or communication by carrier aggregation simultaneously using Band 66 and Band 3 is performed.

In a usage example 2, normal communication using Band 7 alone is performed.

In a usage example 3, communication is performed by carrier aggregation in which one or both of Band 66 and Band 3, and Band 7 are simultaneously used.

Figure 2A:
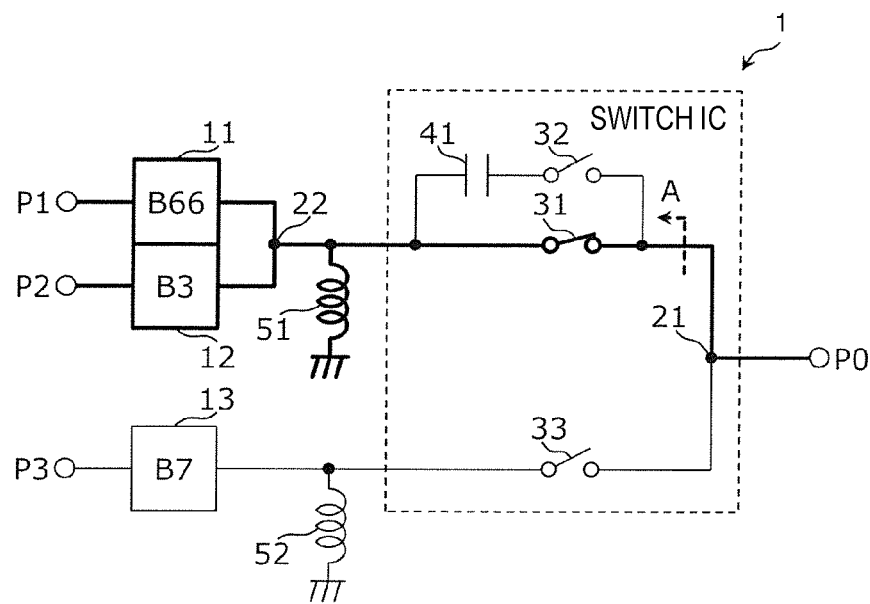
FIG. 2A is a circuit diagram illustrating a usage example of the multiplexer according to the first embodiment.

FIG. 2A is a circuit diagram illustrating the usage example 1 of the multiplexer 1. As illustrated in FIG. 2A, in the usage example 1 of the multiplexer 1, the switch 31 is in a connected state, and the switches 32 and 33 are in a disconnected state. In FIG. 2A, circuit elements connected by the switch in the usage example 1 of the multiplexer 1 are indicated by bold lines.

Figure 2B:
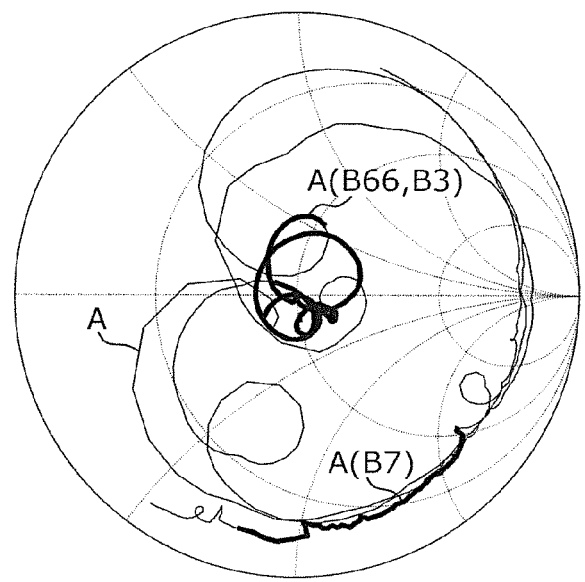
FIG. 2B is a Smith chart illustrating an example of an impedance when a filter side is seen from a point A in the usage example of the multiplexer according to the first embodiment.

FIG. 2B is a Smith chart illustrating an example of an impedance A when a filter side is seen from a point A in the usage example 1 of the multiplexer 1. As illustrated in FIG. 2B, the impedance A lies at a position A(B66, B3) near a reference impedance of, for example, 50Ω in Band 66 and Band 3, and lies at a position A(B7) that is on a capacitive side and that is on an open-circuit side in Band 7. Here, the reference impedance refers to an impedance which serves as a reference of a transmission system in which the multiplexer 1 is provided, and is used as a similar meaning. The reference impedance is not limited to 50Ω, and may be 75Ω or the like.

In the usage example 1 of the multiplexer 1, it is found from the impedance A in FIG. 2B that matching in Band 66 and Band 3 is substantially achieved at the terminal P0.

Figure 3A:
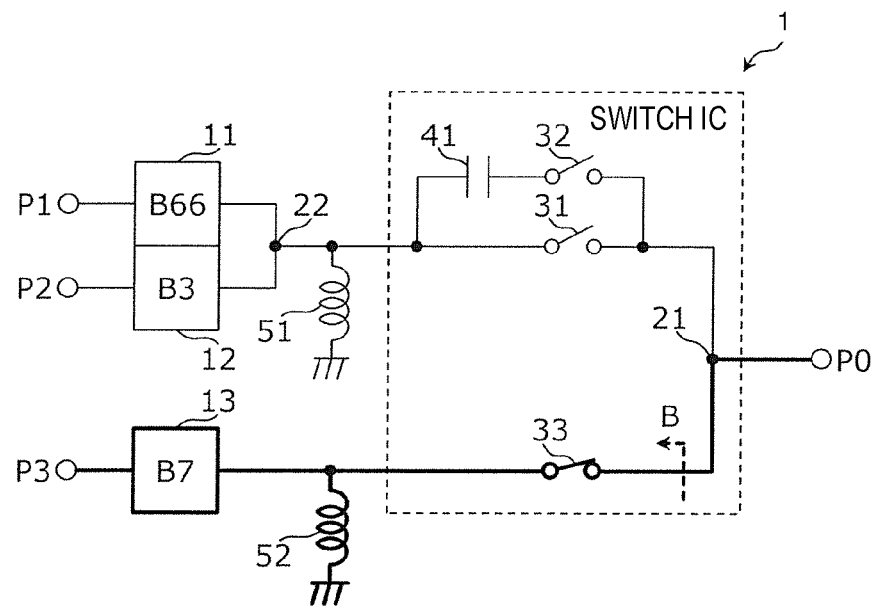
FIG. 3A is a circuit diagram illustrating a usage example of the multiplexer according to the first embodiment.

FIG. 3A is a circuit diagram illustrating a usage example 2 of the multiplexer 1. As illustrated in FIG. 3A, in the usage example 2 of the multiplexer 1, the switches 31 and 32 are in a disconnected state, and the switch 33 is in a connected state. In FIG. 3A, in the usage example 2 of the multiplexer 1, circuit elements connected by the switch are indicated by bold lines.

Figure 3B:
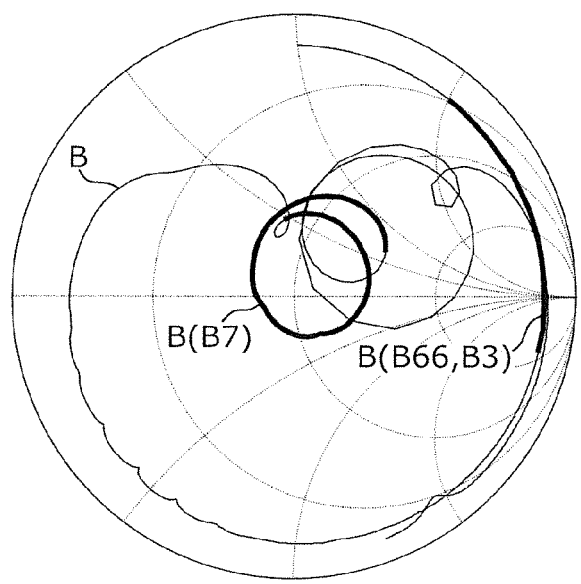
FIG. 3B is a Smith chart illustrating an example of an impedance when a filter side is seen from a point B in the usage example of the multiplexer according to the first embodiment.

FIG. 3B is a Smith chart illustrating an example of an impedance B when a filter side is seen from a point B in the usage example 2 of the multiplexer 1. As illustrated in FIG. 3B, the impedance B is at a position B(B7) that slightly shifts to an inductive side from the reference impedance in Band 7, and is at a position B(B66, B3) that is on an inductive side and that is on an open-circuit side in Band 66 and Band 3.

In the usage example 2 of the multiplexer 1, it can be seen from the impedance B in FIG. 3B that matching in Band 7 is substantially achieved at the terminal P0.

Figure 4A:
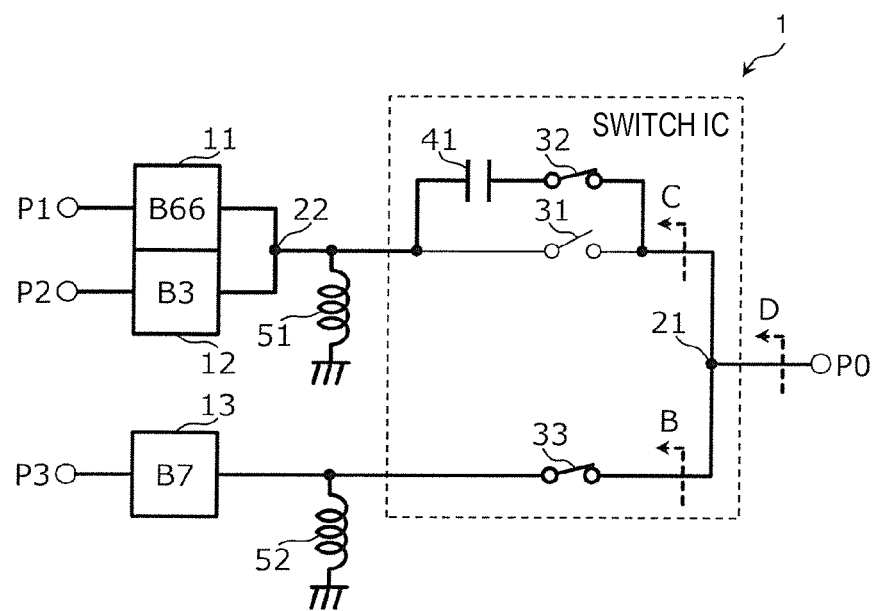
FIG. 4A is a circuit diagram illustrating a usage example of the multiplexer according to the first embodiment.

FIG. 4A is a circuit diagram illustrating a usage example 3 of the multiplexer 1. As illustrated in FIG. 4A, in the usage example 3 of the multiplexer 1, the switch 31 is in a disconnected state and the switches 32 and 33 are in a connected state. In FIG. 4A, circuit elements connected by the switches in the usage example 3 of the multiplexer 1 are indicated by bold lines.

Figure 4B:
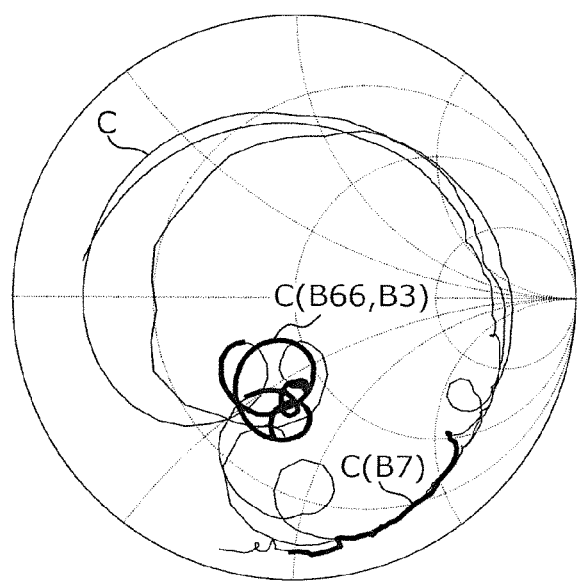
FIG. 4B is a Smith chart illustrating an example of an impedance when a filter side is seen from a point C in the usage example of the multiplexer according to the first embodiment.

FIG. 4B is a Smith chart illustrating an example of an impedance C when a filter side is seen from a point C in the usage example 3 of the multiplexer 1. The impedance C is at a position in which the impedance A in FIG. 2B is rotated counterclockwise by an amount corresponding to a capacitance value of the capacitor 41 along a constant resistance circle.

A position C(B66, B3) of the impedance C in Band 66 and Band 3 lies on a capacitive side as compared to the position A(B66, B3) of the impedance A. Further, a position C(B7) of the impedance C in Band 7 lies on an open-circuit side as compared to the position A(B7) of the impedance A in FIG. 2B.

Figure 4C:
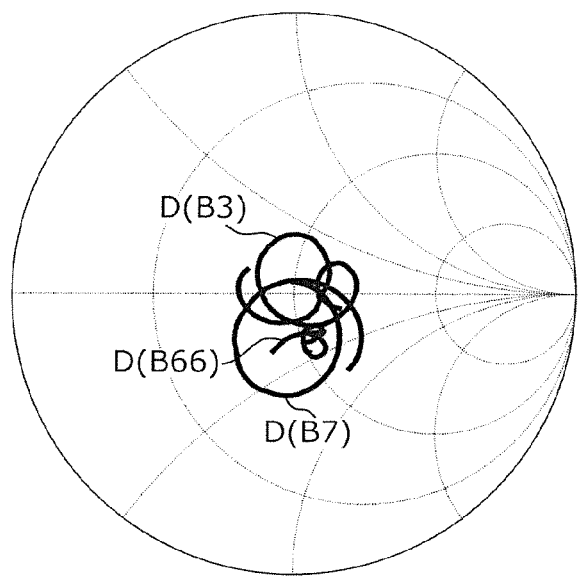
FIG. 4C is a Smith chart illustrating an example of an impedance when a filter side is seen from a point D in the usage example of the multiplexer according to the first embodiment.

FIG. 4C is a Smith chart illustrating an example of an impedance D when a filter side is seen from a point D in the usage example 3 of the multiplexer 1. An impedance D is an impedance obtained by combining the impedance B in FIG. 3B and the impedance C in FIG. 4B.

Positions D(B66), D(B3), and D(B7) of the impedance D in Band 66, Band 3, and Band 7 lie near the reference impedance by combining the slightly inductive impedance B and the capacitive impedance C.

In the usage example 3 of the multiplexer 1, it can be seen from the impedance D in FIG. 4C that matching in Band 66, Band 3, and Band 7 is substantially achieved at the terminal P0.

In addition, in the usage example 3 of the multiplexer 1, by using the capacitor 41, the position C(B7) of the impedance C in Band 7 shifts to an open-circuit side, and thus a return loss in Band 7 when a filter side is seen from the point C is improved.

Figure 4D:
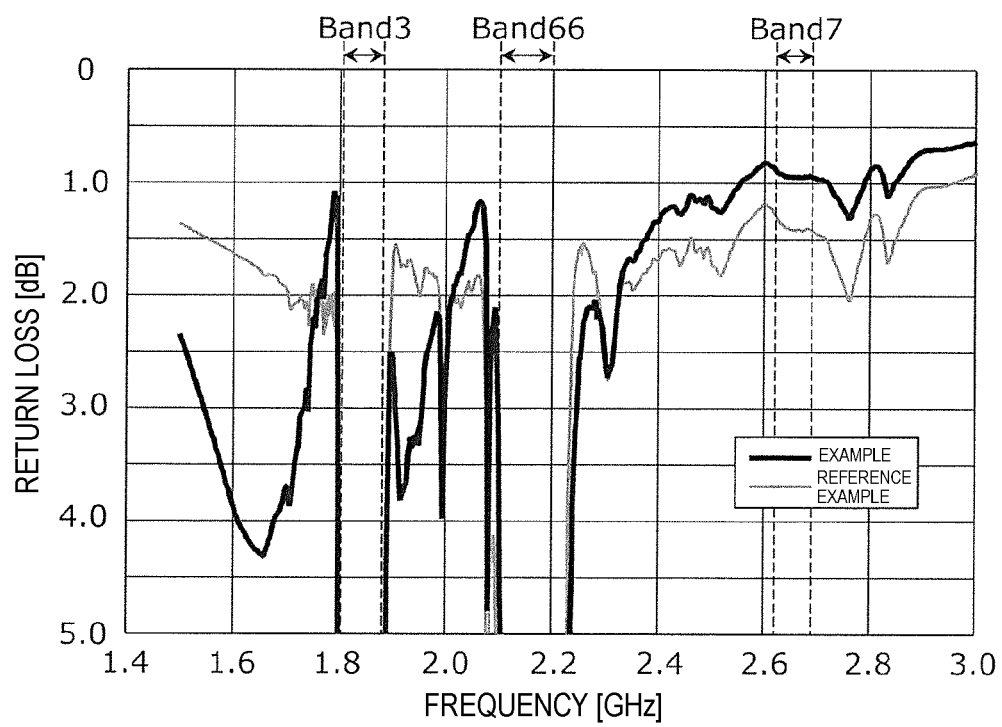
FIG. 4D is a graph illustrating an example of a return loss when a filter side is seen from a terminal P0 in the usage example of the multiplexer according to the first embodiment.

FIG. 4D is a graph illustrating, as an example, the return loss when the filter side is seen from the point C in the usage example 3 of the multiplexer 1. In FIG. 4D, for a purpose of comparison, in a case where the switches 31 and 33 are in a connected state and the switch 32 is in a disconnected state, a return loss when the filter side is seen from the point C is illustrated as a reference example. As can be seen in FIG. 4D, it is understood that the return loss in Band 7 is improved by using the capacitor 41.

As described above, according to the multiplexer 1, the filters 11 and 12 are connected at the connection point 22, and connection and disconnection between the connection point 22 and the terminal P0 and between the filter 13 and the terminal P0 are switched by the switches 31 to 33. As a result, compared to a configuration in which connection and disconnection between the signal path connected to each of the filters 11, 12, and 13 and the terminal P0 are individually switched, the number of the signal paths selected by the switches is reduced, and thus it is possible to reduce a loss of the switches and a return loss due to parasitic capacitances.

Further, since the filters 11 and 12 whose pass bands are adjacent to each other are connected to the connection point 22, mismatching at the connection point 22 is less likely to occur.

Mismatching that occurs when the filters 11 to 13 are connected to the connection point 21 is reduced by using the reactance element.

In this way, according to the configuration described above, the multiplexer having a simple configuration and excellent characteristics can be obtained.

Second Embodiment

A multiplexer according to a second embodiment is configured by adding a filter to the multiplexer 1 according to the first embodiment. The filter added in the second embodiment is connected to the connection point 21 via a switch. In the following description, the same constituent elements as those in the first embodiment are referred by using the same reference signs. Further, description of the matters described in the first embodiment will be omitted as appropriate.

Figure 5:
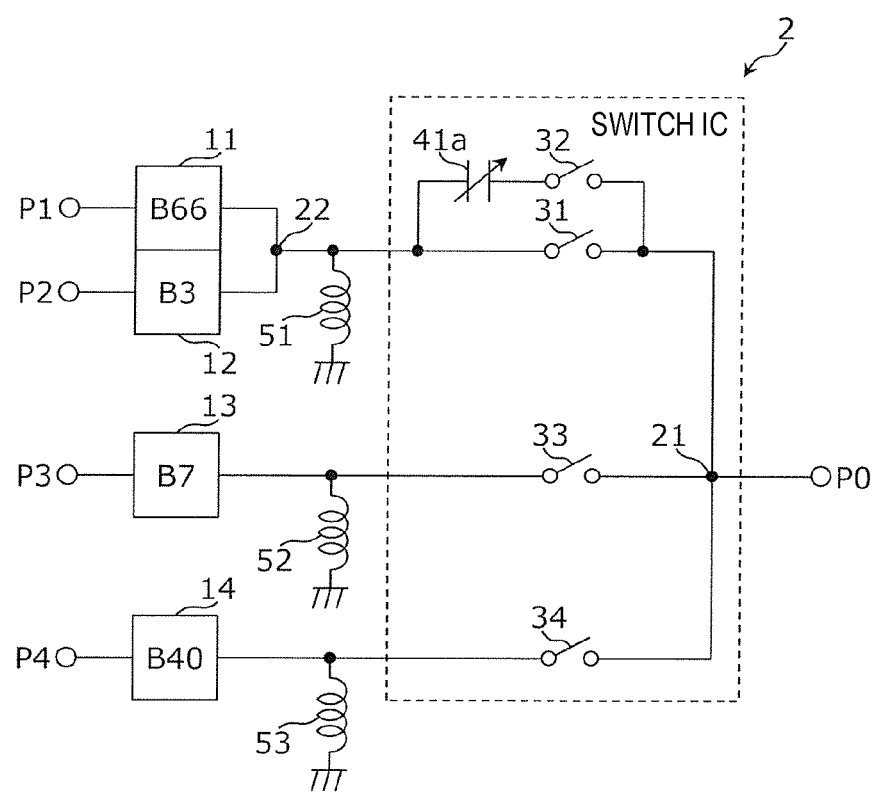
FIG. 5 is a circuit diagram illustrating an example of a configuration of a multiplexer according to a second embodiment.

FIG. 5 is a circuit diagram illustrating an example of the configuration of the multiplexer according to the second embodiment. As illustrated in FIG. 5, a multiplexer 2 differs from the multiplexer 1 in FIG. 1 in that a filter 14, a switch 34, an inductor 53, and a terminal P4 are added, and in that the capacitor 41 is changed to a capacitor 41a whose capacitance value can be variably controlled. The switches 31 to 34 and the capacitor 41a may be formed in a switch IC which is a single integrated circuit device.

The filter 14 is a band pass filter whose pass band is a fourth frequency band. The fourth frequency band is, for example, a frequency band of 2300 MHz to 2400 MHz in Band 40 defined by 3GPP. The filter 14 may be an acoustic wave filter.

One end of the filter 14 is connected to one end of the switch 34, and the other end thereof is connected to the terminal P4. The other end of the switch 34 is connected to the connection point 21. The switch 34 switches between connection and disconnection between one end of the filter 14 and the connection point 21.

The inductor 53 is a phase circuit for adjusting an impedance at one end of the filter 14. One end of the inductor 53 is connected to a signal path connecting the filter 14 and the switch 34, and the other end thereof is connected to a ground electrode. The inductor 53 may be omitted.

Here, the filter 14 is an example of a fourth filter. The switch 34 is an example of a fourth switch. The capacitor 41a is an example of a reactance element whose reactance value can be variably controlled.

Next, a usage example of the multiplexer 2 will be described. In the following description, Band 66, Band 3, Band 7, and Band 40 are an example of a band group that may be simultaneously used in carrier aggregation.

In a usage example 1, normal communication using Band 66 or Band 3 alone or communication by carrier aggregation simultaneously using Band 66 and Band 3 is performed.

In a usage example 2, normal communication using Band 7 alone is performed.

In a usage example 3, communication is performed by carrier aggregation in which one or both of Band 66 and Band 3, and Band 7 are simultaneously used.

The usage examples 1 to 3 of the multiplexer 2 are exactly the same as the usage examples 1 to 3 of the multiplexer 1 by setting the switch 34 to be in a disconnected state, and therefore, description thereof will be omitted.

In a usage example 4, normal communication using Band 40 alone is performed.

In a usage example 5, communication is performed by carrier aggregation in which one or both of Band 66 and Band 3 and Band 40 are simultaneously used.

In a usage example 6, communication is performed by carrier aggregation in which one or both of Band 66 and Band 3, and Band 7 and Band 40 are simultaneously used.

Figure 6A:
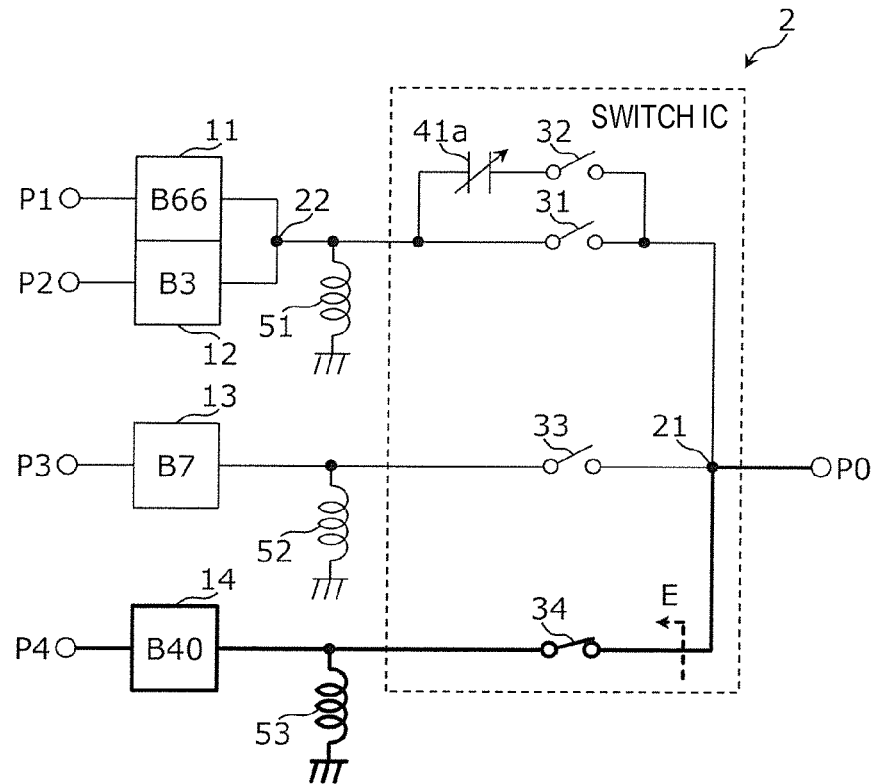
FIG. 6A is a circuit diagram illustrating a usage example of the multiplexer according to the second embodiment.

FIG. 6A is a circuit diagram illustrating the usage example 4 of the multiplexer 2. As illustrated in FIG. 6A, in the usage example 4 of the multiplexer 2, the switches 31 to 33 are in a disconnected state, and the switch 34 is in a connected state. In FIG. 6A, circuit elements connected by the switch in the usage example 4 of the multiplexer 2 are indicated by bold lines.

Figure 6B:
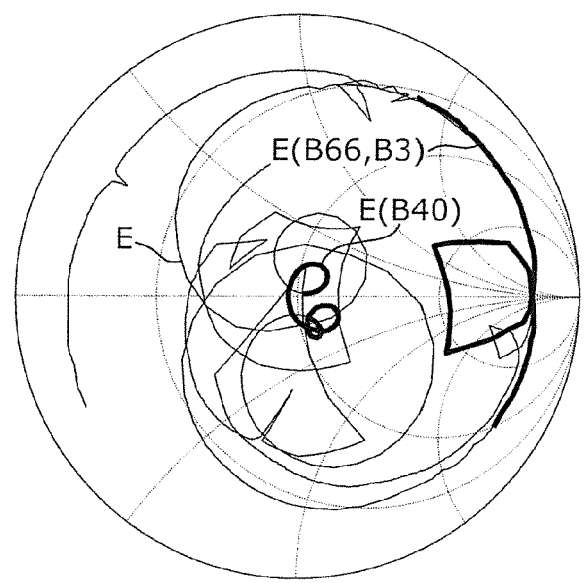
FIG. 6B is a Smith chart illustrating an example of an impedance when a filter side is seen from a point E in the usage example of the multiplexer according to the second embodiment.

FIG. 6B is a Smith chart illustrating an example of an impedance E when a filter side is seen from a point E in the usage example 4 of the multiplexer 2. As illustrated in FIG. 6B, the impedance E is at a position E(B40) near the reference impedance in Band 40, and is at a position E(B66, B3) on an open-circuit side in Band 66 and Band 3.

In the usage example 4 of the multiplexer 2, it can be seen from the impedance E in FIG. 6B that matching in Band 40 is achieved at the terminal P0.

Figure 7A:
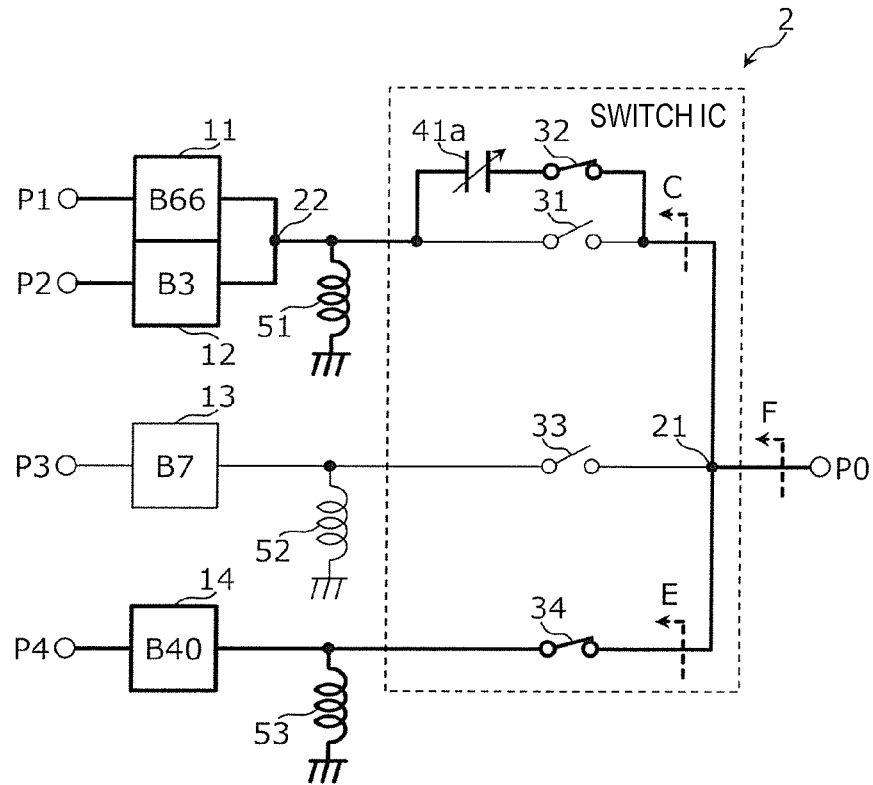
FIG. 7A is a circuit diagram illustrating a usage example of the multiplexer according to the second embodiment.

FIG. 7A is a circuit diagram illustrating the usage example 5 of the multiplexer 2. As illustrated in FIG. 7A, in the usage example 5 of the multiplexer 2, the switches 31 and 33 are in a disconnected state, and the switches 32 and 34 are in a connected state. In FIG. 7A, circuit elements connected by the switches in the usage example 5 of the multiplexer 2 are indicated by bold lines.

Figure 7B:
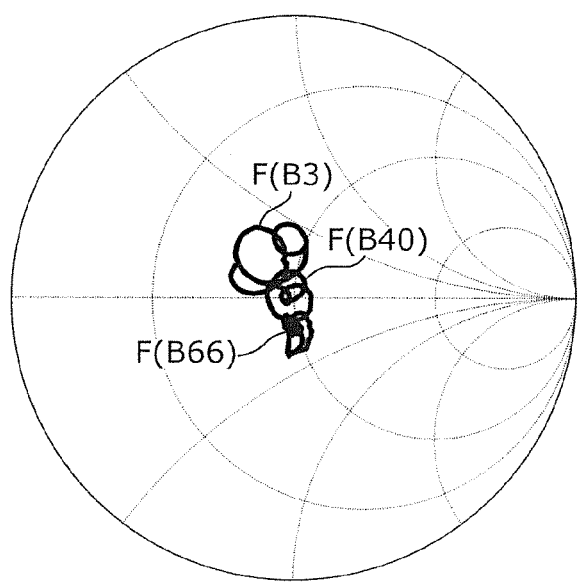
FIG. 7B is a Smith chart illustrating an example of an impedance when a filter side is seen from a point F in the usage example of the multiplexer according to the second embodiment.

FIG. 7B is a Smith chart illustrating an example of an impedance F when a filter side is seen from a point F in the usage example 5 of the multiplexer 2. The impedance F is an impedance obtained by combining an impedance (not illustrated) when a filter side is seen from the point C and the impedance E illustrated in FIG. 6B.

Positions F(B66), F(B3), and F(B40) of the impedance F in Band 66, Band 3, and Band 40 are near the reference impedance. Therefore, in the usage example 5 of the multiplexer 2, it can be seen that matching in Band 66, Band 3, and Band 40 is substantially achieved at the terminal P0.

In the multiplexer 2, since the capacitance value of the capacitor 41a is variable, the impedance when the filter side is seen from the point C can be optimized according to an impedance of the filter to be simultaneously used. For example, in the usage example 3 in which Band 66, Band 3, and Band 7 are simultaneously used, the impedance when the filter side is seen from the point C is optimized so that more accurate matching is achieved when the impedance is combined with an impedance B corresponding to Band 7. Additionally, in the usage example 5 in which Band 66, Band 3, and Band 40 are simultaneously used, the impedance when the filter side is seen from the point C is optimized so that more accurate matching is achieved when the impedance is combined with the impedance E corresponding to Band 40. As described above, by using the variable capacitor is used as the capacitor 41a, it is possible to achieve more accurate matching for each combination of bands to be used in carrier aggregation.

Figure 8A:
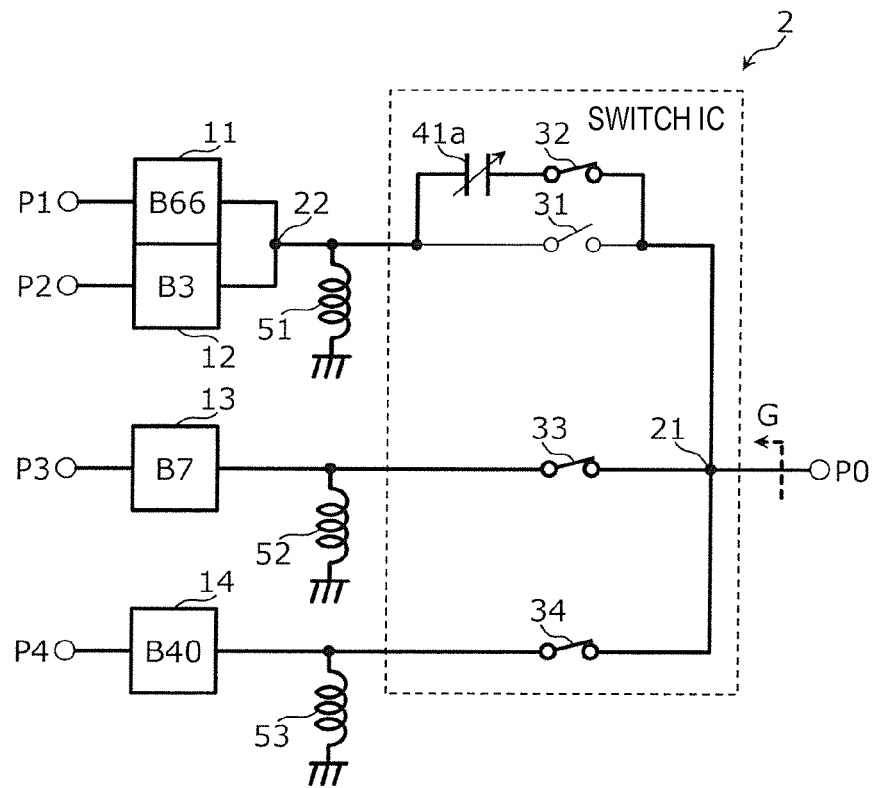
FIG. 8A is a circuit diagram illustrating a usage example of the multiplexer according to the second embodiment.

FIG. 8A is a circuit diagram illustrating the usage example 6 of the multiplexer 2. As illustrated in FIG. 8A, in the usage example 6 of the multiplexer 2, the switch 31 is in a disconnected state, and the switches 32 to 34 are in a connected state. In FIG. 8A, circuit elements connected by the switches in the usage example 6 of the multiplexer 2 are indicated by bold lines.

Figure 8B:
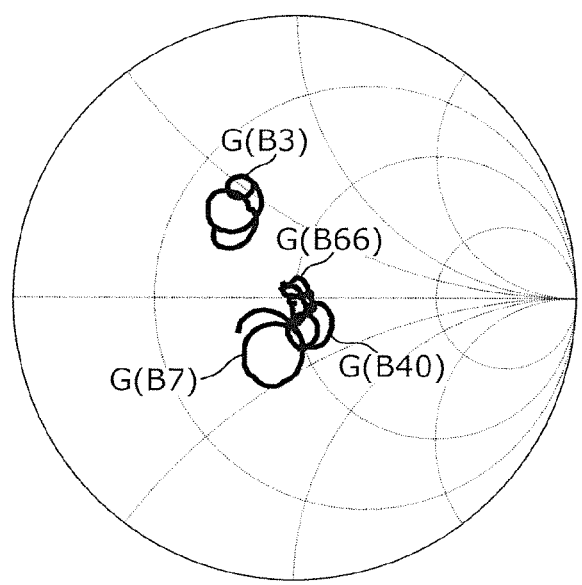
FIG. 8B is a Smith chart illustrating an example of an impedance when a filter side is seen from a point G in the usage example of the multiplexer according to the second embodiment.

FIG. 8B is a Smith chart illustrating an example of an impedance G when a filter side is seen from a point G in the usage example 6 of the multiplexer 2. The impedance G is an impedance obtained by combining an impedance (not illustrated) when a filter side is seen from the point C, the impedance B in FIG. 3B, and the impedance E in FIG. 6B.

Positions G(B66), G(B7), and G(B40) of the impedance G in Band 66, Band 7, and Band 40 are near the reference impedance, whereas a position G(B3) of the impedance G in Band 3 is at a position that significantly shifts to an inductive side from the reference impedance.

In the usage example 6 of the multiplexer 2, as can be seen in the impedance G in FIG. 8B, it is understood that mismatching in Band 3 at the terminal P0 is larger than mismatching in Band 66, Band 7, and Band 40. Note that the mismatching in Band 3 at the terminal P0 occurs similarly in carrier aggregation of three bands in which Band 3, Band 7, and Band 40 are simultaneously used.

Third Embodiment

As described in the second embodiment, when the filter connected to the connection point 22 and a plurality of other filters are connected to the connection point 21 in the multiplexer 2, mismatching in the pass band of the filter connected to the connection point 22 may be increased. For example, when at least Band 3, Band 7, and Band 40 are simultaneously used in the usage example 6 of the multiplexer 2, the mismatching in Band 3 becomes large. In a third embodiment, a multiplexer in which such mismatching is reduced will be described.

The multiplexer according to the third embodiment is configured by adding a filter to the multiplexer 1 according to the first embodiment. The filter added in the third embodiment is connected to the connection point 22. In the following description, the same constituent elements as those in the first embodiment are referred by using the same reference signs. Further, description of the matters described in the first embodiment will be omitted as appropriate.

Figure 9A:
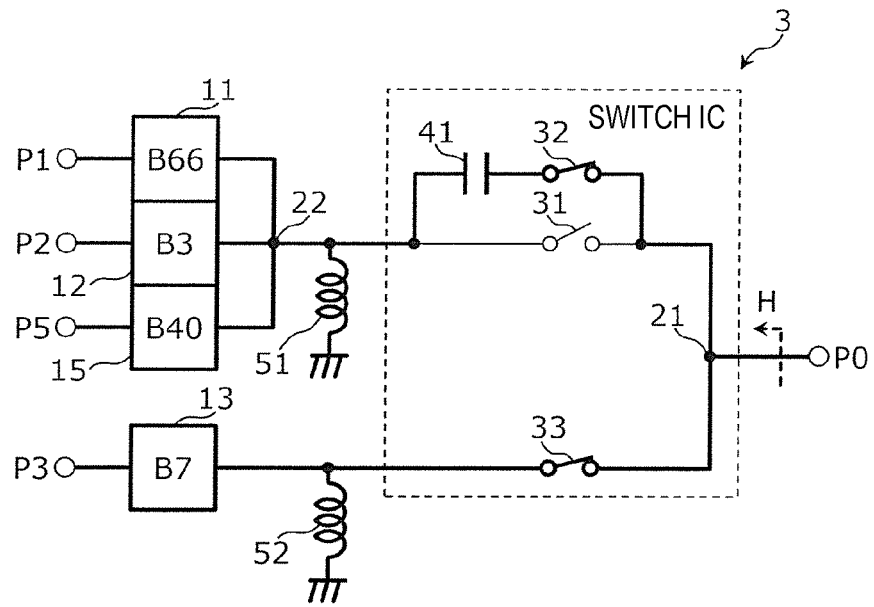
FIG. 9A is a circuit diagram illustrating an example of a configuration of a multiplexer according to a third embodiment.

FIG. 9A is a circuit diagram illustrating an example of the configuration of the multiplexer according to the third embodiment. As illustrated in FIG. 9A, a multiplexer 3 differs from the multiplexer 1 illustrated in FIG. 1 in that a filter 15 and a terminal P5 are added. The switches 31 to 33 and the capacitor 41 may be formed in a switch IC which is a single integrated circuit device.

The filter 15 is a band pass filter whose pass band is a fifth frequency band. The fifth frequency band is, for example, a frequency band of 2300 MHz to 2400 MHz in Band 40 defined by 3GPP. The filter 15 may be an acoustic wave filter.

One end of the filter 15 is connected to the connection point 22, and the other end thereof is connected to the terminal P5. Here, the filter 15 is an example of a fifth filter.

In a usage example of the multiplexer 3, communication is performed by carrier aggregation in which one or more bands among Band 66, Band 3, and Band 40, and Band 7 are simultaneously used. As illustrated in FIG. 9A, in the usage example of the multiplexer 3, the switch 31 is in a disconnected state, and the switches 32 and 33 are in a connected state. In FIG. 9A, circuit elements connected by the switches in the usage example of the multiplexer 3 are indicated by bold lines.

Figure 9B:
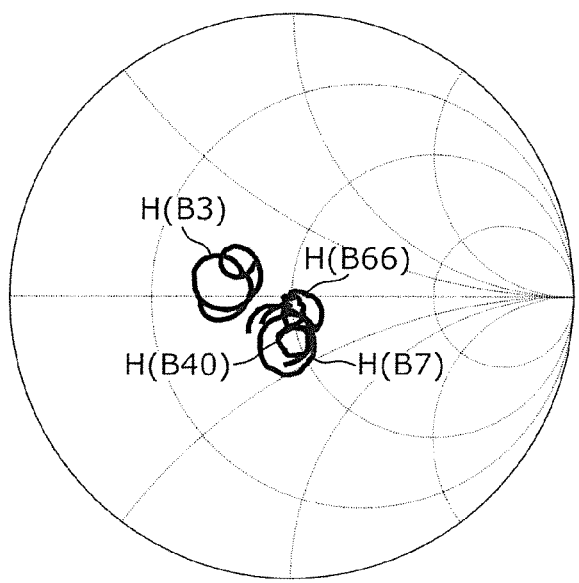
FIG. 9B is a Smith chart illustrating an example of an impedance when a filter side is seen from a point H in a usage example of the multiplexer according to the third embodiment.

FIG. 9B is a Smith chart illustrating an example of an impedance when a filter side is seen from a point H in the usage example of the multiplexer 3.

Positions H(B66), H(B3), H(B40), and H(B7) of an impedance H in Band 66, Band 3, Band 40, and Band 7 are near the reference impedance. For this reason, in the usage example of the multiplexer 3, it can be seen that matching of Band 66, Band 3, Band 40, and Band 7 is substantially achieved at the terminal P0.

Figure 9C:
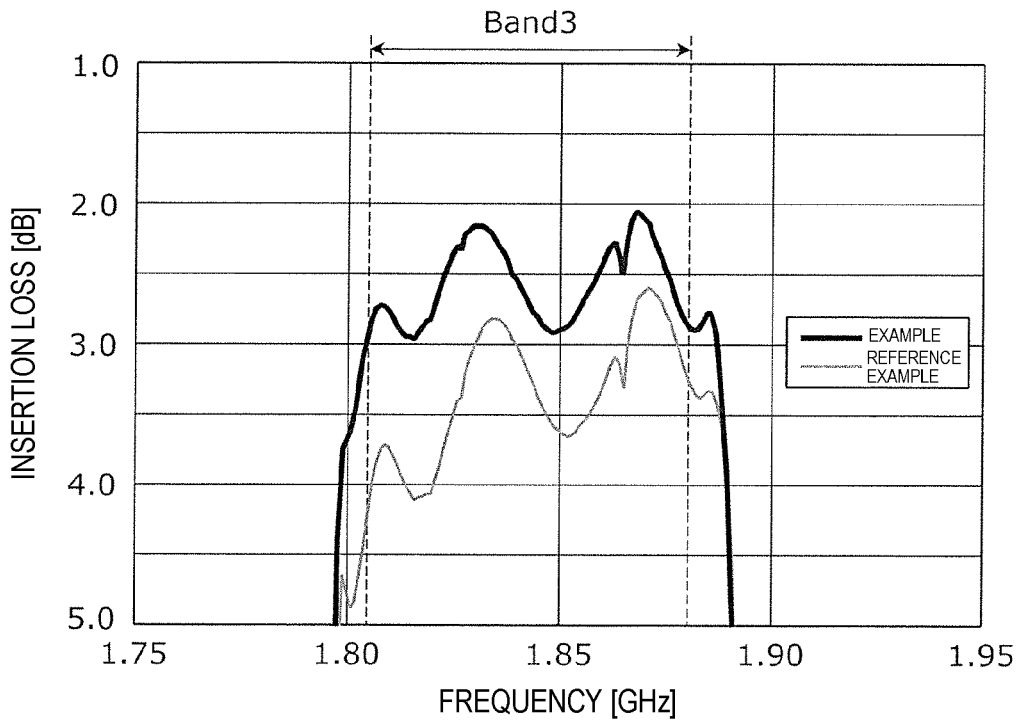
FIG. 9C is a graph illustrating an example of an insertion loss between the terminal P0 and a terminal P2 in the usage example of the multiplexer according to the third embodiment.

FIG. 9C is a graph illustrating an example of an insertion loss between the terminal P0 and the terminal P2 in the usage example of the multiplexer 3 as an example. In FIG. 9C, for a purpose of comparison, an example of an insertion loss between the terminal P0 and the terminal P2 in the usage example 6 of the multiplexer 2 in FIG. 8A is illustrated as a reference example. As can be seen in FIG. 9C, it is understood that the insertion loss in Band 3 is improved.

In this way, in carrier aggregation in which specific bands are simultaneously used, in a case where matching cannot be sufficiently achieved in the configuration of the multiplexer 2, when the configuration of the multiplexer 3 is adopted, more accurate matching may be achieved. Specifically, in the multiplexer 3, it is possible to achieve more accurate matching in Band 3 in carrier aggregation in which four bands of Band 66, Band 3, Band 7, and Band 40, or three bands of band 3, band 7, and band 40 are simultaneously used, than that in the multiplexer 2.

Fourth Embodiment

A multiplexer according to a fourth embodiment is configured by adding a switch and an inductor to the multiplexer 1 according to the first embodiment. The switch and the inductor added in the fourth embodiment are connected in series, and are connected between the connection point 21 and a ground electrode. In the following description, the same constituent elements as those in the first embodiment are referred by using the same reference signs. Further, description of the matters described in the first embodiment will be omitted as appropriate.

Figure 10:
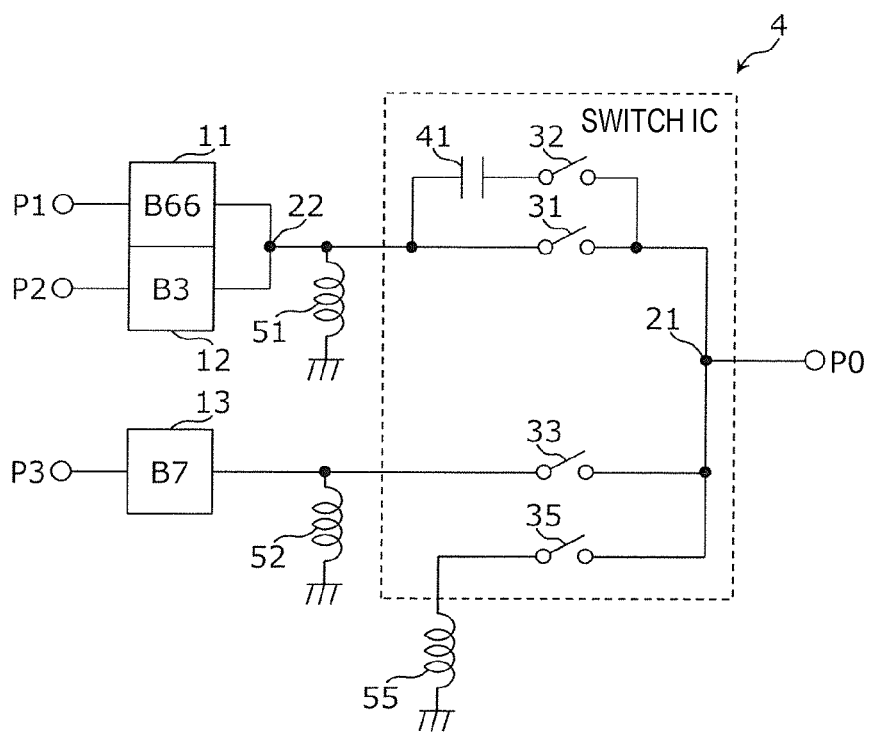
FIG. 10 is a circuit diagram illustrating an example of a configuration of a multiplexer according to a fourth embodiment.

FIG. 10 is a circuit diagram illustrating an example of the configuration of the multiplexer according to the fourth embodiment. As illustrated in FIG. 10, a multiplexer 4 differs from the multiplexer 1 in FIG. 1 in that a switch 35 and an inductor 55 are added. The switches 31 to 33 and 35 and the capacitor 41 may be formed in a switch IC which is a single integrated circuit device. The switch IC may be provided with a terminal for connecting the inductor 55.

One end of the inductor 55 is connected to a ground electrode.

The other end of the inductor 55 is connected to one end of the switch 35, and the other end of the switch 35 is connected to the connection point 21. The switch switches between connection and disconnection between the other end of the inductor 55 and the connection point 21.

Here, the inductor 55 is an example of a first inductor. The switch 35 is an example of a fifth switch.

Next, a usage example of the multiplexer 4 will be described. In the following description, Band 66, Band 3, and Band 7 are an example of a band group that may be simultaneously used in carrier aggregation.

In a usage example 1, normal communication using Band 66 or Band 3 alone or communication by carrier aggregation simultaneously using Band 66 and Band 3 is performed.

In a usage example 2, normal communication using Band 7 alone is performed.

In a usage example 3, communication is performed by carrier aggregation in which one or both of Band 66 and Band 3, and Band 7 are simultaneously used.

The usage examples 1 and 3 of the multiplexer 4 are totally the same as the usage examples 1 and 3 of the multiplexer 1 by setting the switch 35 in a disconnected state, and therefore, description thereof will be omitted.

Figure 11A:
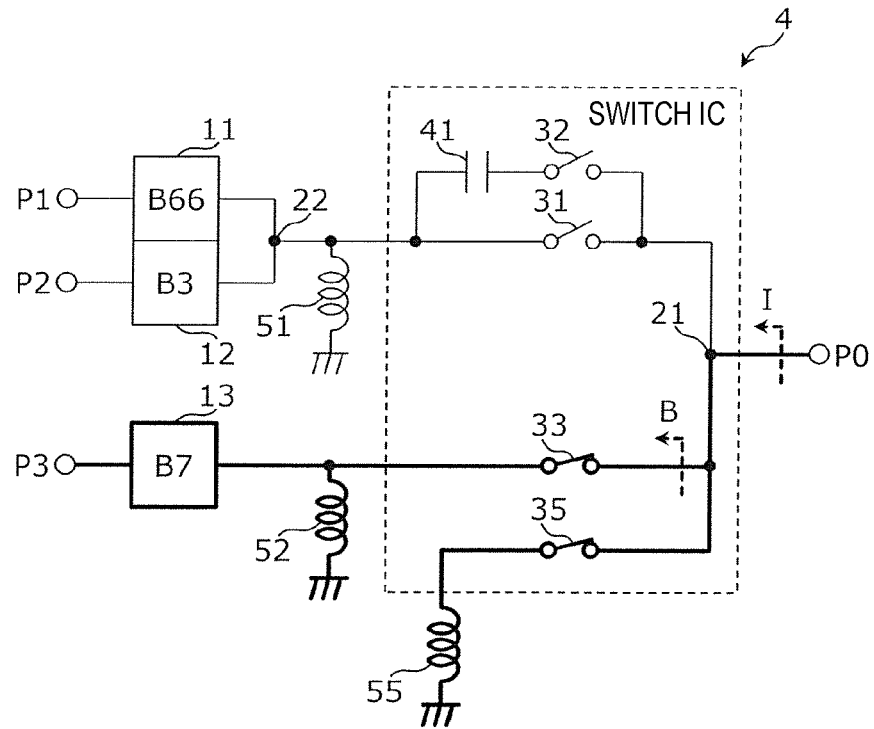
FIG. 11A is a circuit diagram illustrating a usage example of the multiplexer according to the fourth embodiment.

FIG. 11A is a circuit diagram illustrating the usage example 2 of the multiplexer 4. As illustrated in FIG. 11A, in the usage example 2 of the multiplexer 4, the switches 31 and 32 are in a disconnected state, and the switches 33 and 35 are in a connected state. In FIG. 11A, circuit elements connected by the switches in the usage example 2 of the multiplexer 4 are indicated by bold lines.

Figure 11B:
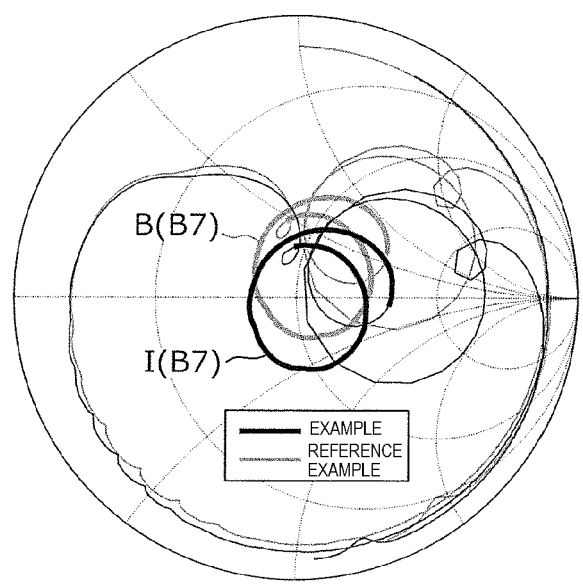
FIG. 11B is a Smith chart illustrating an example of an impedance when a filter side is seen from a point I in the usage example of the multiplexer according to the fourth embodiment.

FIG. 11B is a Smith chart illustrating an example of an impedance I when a filter side is seen from a point I in the usage example 2 of the multiplexer 4 as an example. FIG. 11B illustrates, as a reference example, an impedance when a filter side is seen from the point I, in a case where the inductor 55 is not provided, that is, in a case where the switches 31, 32, and 35 are in a disconnected state and the switch 33 is in a connection state. The impedance in the reference example is equal to the impedance B in FIG. 3B.

The impedance B in the reference example is at a position B(B7) that slightly shifts to an inductive side from the reference impedance in Band 7 so that accurate matching can be achieved when the impedance B is combined with the impedance C. That is, the impedance B includes intentional mismatching. Therefore, when the filter 13 is used alone, optimum matching cannot be achieved due to the mismatching included in the impedance B.

In the multiplexer 4, when the filter 13 is used alone, the mismatching included in the impedance B can be reduced by the inductor 55.

Figure 11C:
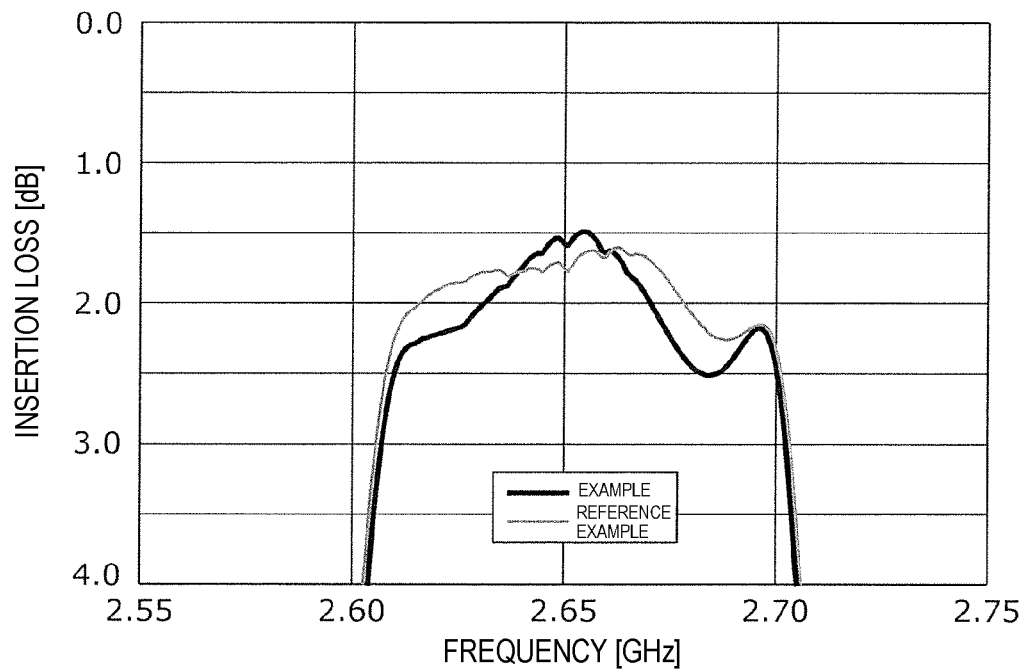
FIG. 11C is a graph illustrating an example of an insertion loss between the terminal P0 and a terminal P3 in the usage example of the multiplexer according to the fourth embodiment.

FIG. 11C is a graph illustrating an example of an insertion loss between the terminal P0 and the terminal P3 in the usage example 2 of the multiplexer 4 as an example. In FIG. 11C, for a purpose of comparison, an insertion loss between the terminal P0 and the terminal P3 in the usage example 2 of the multiplexer 1 in FIG. 3A is illustrated as a reference example. From FIG. 11C, it can be seen that the insertion loss in Band 3 when the filter 13 is used alone is improved by providing the inductor 55.

Fifth Embodiment

A multiplexer according to a fifth embodiment is configured by adding an inductor 56 to the multiplexer 1 according to the first embodiment. In the following description, the same constituent elements as those in the first embodiment are referred by using the same reference signs. Further, description of the matters described in the first embodiment will be omitted as appropriate.

Figure 12:
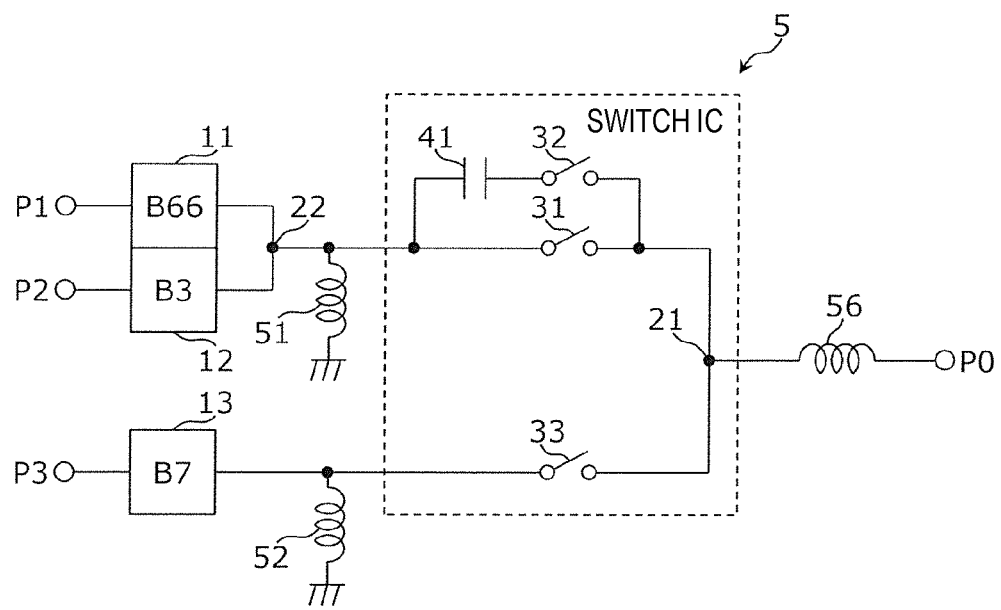
FIG. 12 is a circuit diagram illustrating an example of a configuration of a multiplexer according to a fifth embodiment.

FIG. 12 is a circuit diagram illustrating an example of the configuration of the multiplexer according to the fifth embodiment. As illustrated in FIG. 12, the multiplexer 5 differs from the multiplexer 1 in FIG. 1 in that an inductor 56 is added. The switches 31 to 33 and the capacitor 41 may be formed in a switch IC which is a single integrated circuit device.

One end of the inductor 56 is connected to the connection point 21, and the other end thereof is connected to the terminal P0. That is, the inductor 56 is connected between the connection point 21 and the terminal P0. Here, the inductor 56 is an example of a second inductor.

Next, a usage example of the multiplexer 5 will be described. In the usage example of the multiplexer 5, communication is performed by carrier aggregation in which one or both of Band 66 and Band 3, and Band 7 are simultaneously used.

Figure 13A:
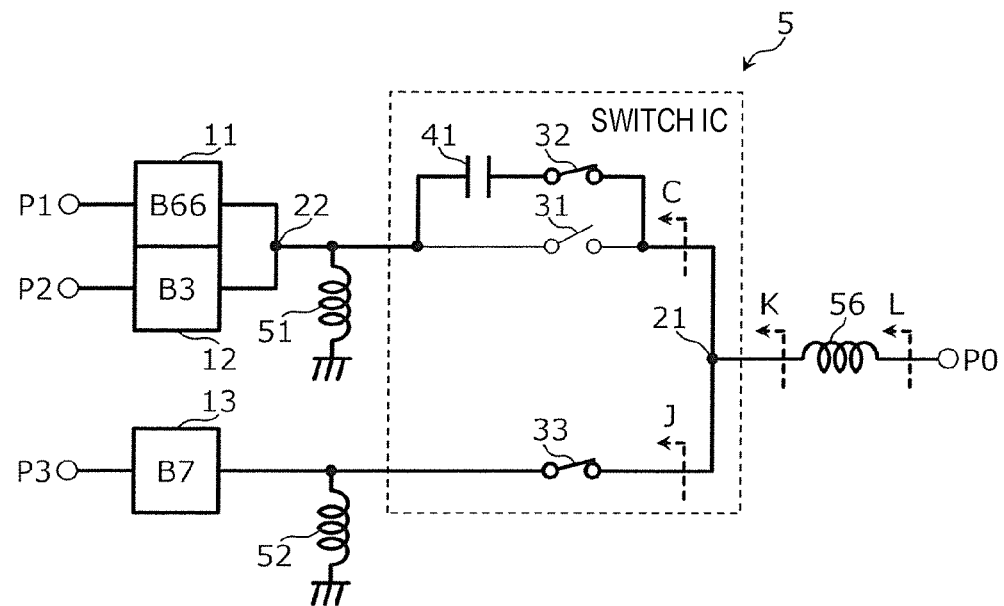
FIG. 13A is a circuit diagram illustrating a usage example of the multiplexer according to the fifth embodiment.

As illustrated in FIG. 13A, in the usage example of the multiplexer 5, the switch 31 is in a disconnected state, and the switches 32 and 33 are in a connected state. In FIG. 13A, circuit elements connected by the switches in the usage example of the multiplexer 3 are indicated by bold lines.

Figure 13B:
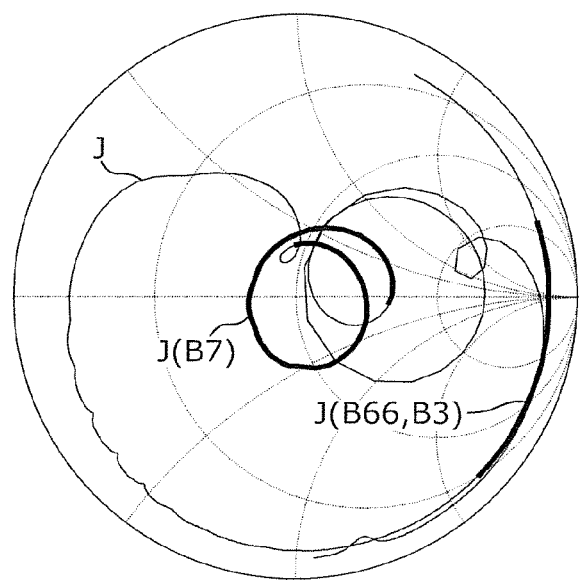
FIG. 13B is a Smith chart illustrating an example of an impedance when a filter side is seen from a point J in the usage example of the multiplexer according to the fifth embodiment.

FIG. 13B is a Smith chart illustrating an example of an impedance when a filter 13 side is seen from a point J in the usage example of the multiplexer 5. As illustrated in FIG. 13B, an impedance J is at a position J(B7) near the reference impedance in Band 7, and is at the position J(B66, B3) on an open-circuit side in Band 66 and Band 3.

In the usage example of the multiplexer 5, it can be seen from the impedance J in FIG. 13B that matching in Band 7 is achieved at the terminal P0. That is, in the multiplexer 5, the impedance J is not adjusted so as to shift to an inductive side. Therefore, the position J(B66, B3) of the impedance J in Band 66 and Band 3 is also on a capacitive side.

Figure 13C:
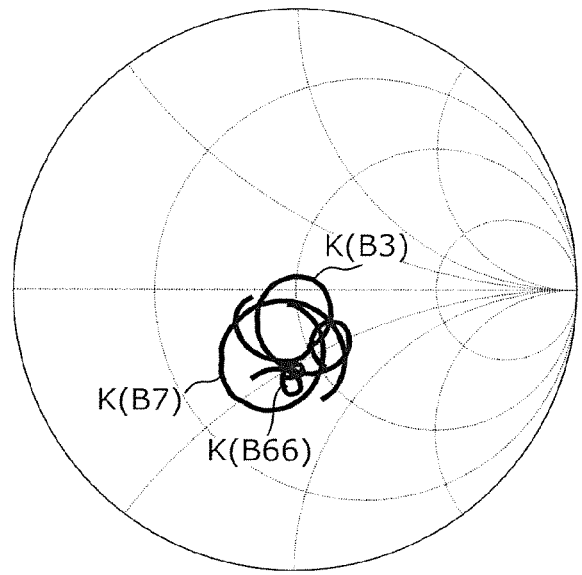
FIG. 13C is a Smith chart illustrating an example of an impedance when a filter side is seen from a point K in the usage example of the multiplexer according to the fifth embodiment.

FIG. 13C is a Smith chart illustrating an example of an impedance K when a connection point 21 side is seen from a point K in the usage example of the multiplexer 5. The impedance K is an impedance obtained by combining an impedance when a switch 32 side is seen from the point C and the impedance J illustrated in FIG. 13B. The impedance when the switch 32 side is seen from the point C is, for example, the impedance C illustrated in FIG. 4B.

Positions K(B66), K(B3), and K(B7) of the impedances K in Band 66, Band 3, and Band 7 gather at a capacitive position by combining the impedance J and the impedance C.

Figure 13D:
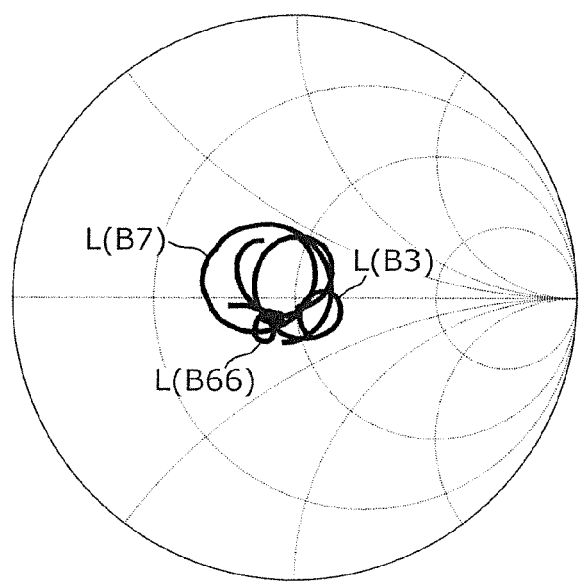
FIG. 13D is a Smith chart illustrating an example of an impedance when a filter side is seen from a point L in the usage example of the multiplexer according to the fifth embodiment.

FIG. 13D is a Smith chart illustrating an example of an impedance L when an inductor 56 side is seen from the point L in the usage example of the multiplexer 5. The impedance L is at a position in which the impedance K in FIG. 13C is rotated clockwise by an amount corresponding to an inductance value of the inductor 56 along a constant resistance circle.

Accordingly, positions L(B66), L(B3), and L(B7) of the impedances L in Band 66, Band 3, and Band 7 are positioned near the reference impedance.

By positioning the impedances J, K, and L as described above, it is possible to achieve matching in Band 66, Band 3, and Band 7 at the terminal P0. Further, since an adjustment amount of the impedance J is suppressed, a loss caused by the adjustment is reduced.

Figure 13E:
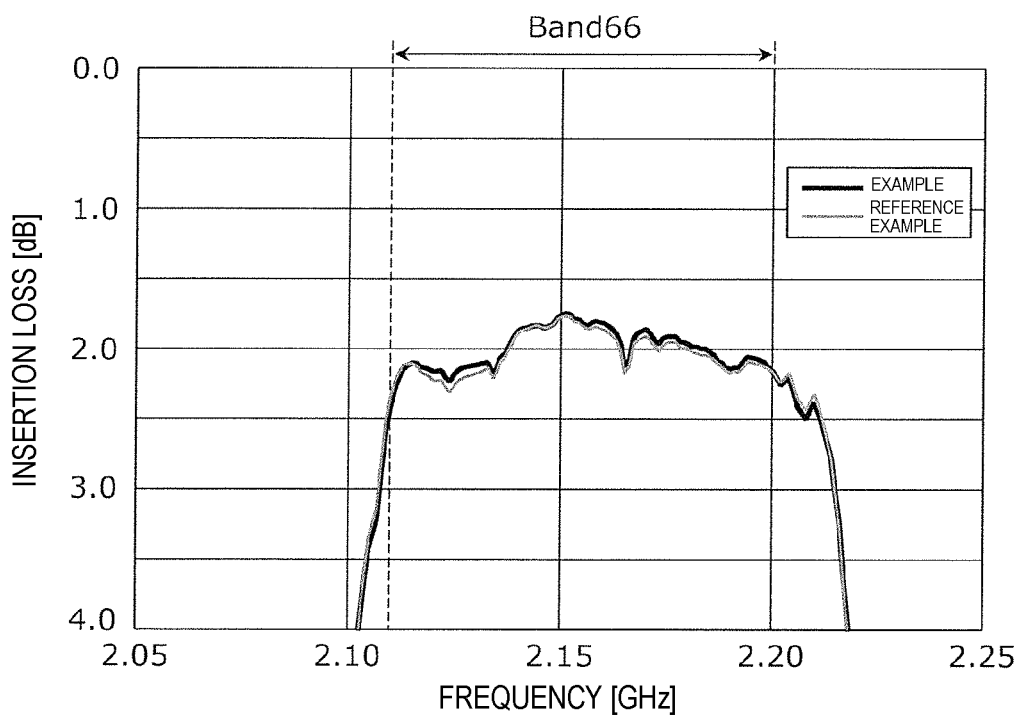
FIG. 13E is a graph illustrating an example of an insertion loss between the terminal P0 and a terminal P1 in the usage example of the multiplexer according to the fifth embodiment.

FIG. 13E is a graph illustrating an example of an insertion loss between the terminal P0 and the terminal P1 in the usage example of the multiplexer 5 as an example. In FIG. 13E, for a purpose of comparison, an insertion loss between the terminal P0 and the terminal P1 in the usage example 3 of the multiplexer 1 in FIG. 4A is illustrated as a reference example.

Figure 13F:
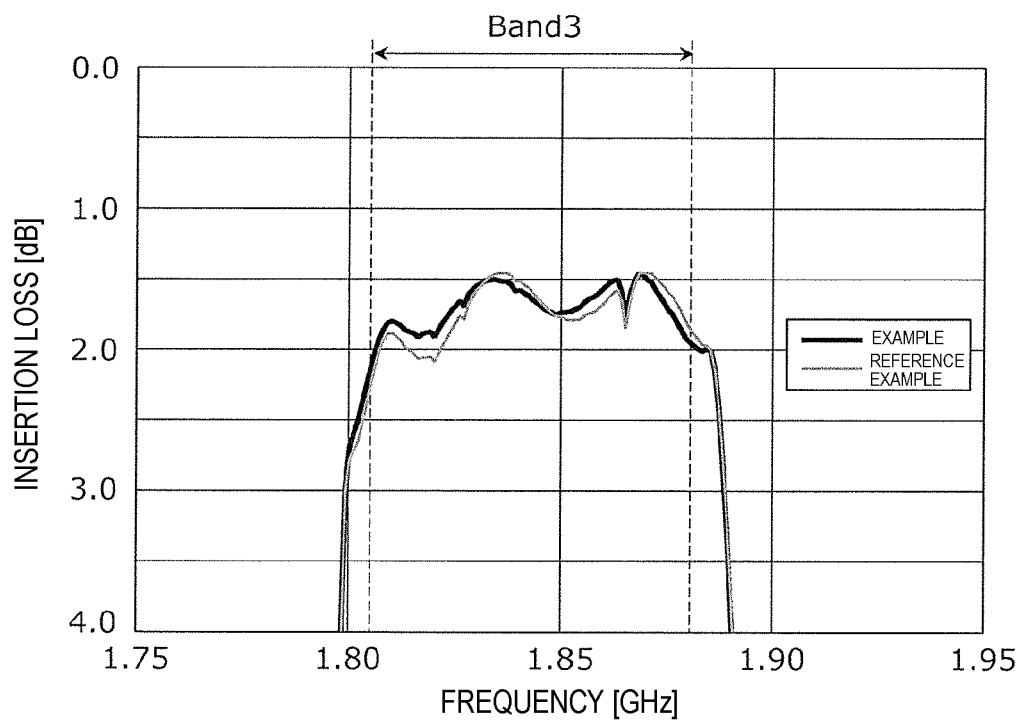
FIG. 13F is a graph illustrating an example of an insertion loss between the terminal P0 and the terminal P2 in the usage example of the multiplexer according to the fifth embodiment.

FIG. 13F is a graph illustrating an example of an insertion loss between the terminal P0 and the terminal P2 in the usage example of the multiplexer 5 as an example. In FIG. 13F, for a purpose of comparison, an insertion loss between the terminal P0 and the terminal P2 in the usage example 3 of the multiplexer 1 in FIG. 4A is illustrated as a reference example.

Figure 13G:
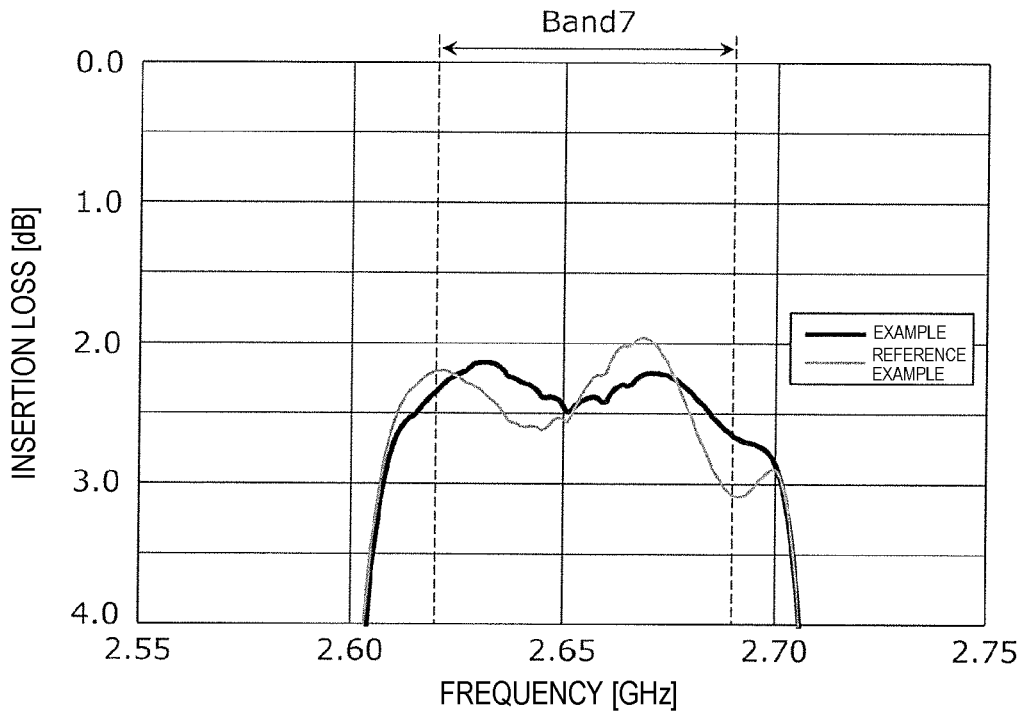
FIG. 13G is a graph illustrating an example of an insertion loss between the terminal P0 and the terminal P3 in the usage example of the multiplexer according to the fifth embodiment.

FIG. 13G is a graph illustrating an example of an insertion loss between the terminal P0 and the terminal P3 in the usage example of the multiplexer 5 as an example. In FIG. 13G, for a purpose of comparison, an insertion loss between the terminal P0 and the terminal P3 in the usage example 3 of the multiplexer 1 in FIG. 4A is illustrated as a reference example.

From the graphs of the insertion losses in FIG. 13E, FIG. 13F, and FIG. 13G, it can be seen that the insertion losses in the multiplexer 5 are improved, compared to the multiplexer 1.

Sixth Embodiment

A multiplexer according to a sixth embodiment is configured by adding a filter and a band elimination filter to the multiplexer 1 according to the first embodiment. In the following description, the same constituent elements as those in the first embodiment are referred by using the same reference signs. Further, description of the matters described in the first embodiment will be omitted as appropriate.

Figure 14:
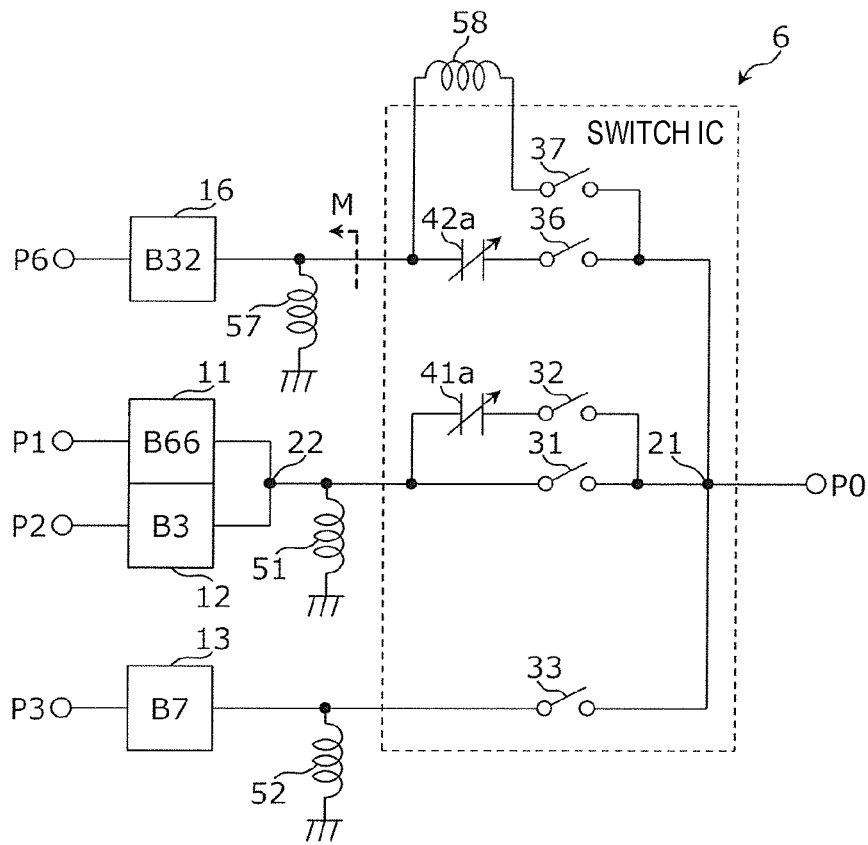
FIG. 14 is a circuit diagram illustrating an example of a configuration of a multiplexer according to a sixth embodiment.

FIG. 14 is a circuit diagram illustrating an example of the configuration of the multiplexer according to the sixth embodiment. As illustrated in FIG. 14, a multiplexer 6 differs from the multiplexer 1 in FIG. 1 in that a filter 16, switches 36 and 37, a capacitor 42a, inductors 57 and 58, and a terminal P6 are added. The switches 31 to 33, 36, and 37, and the capacitors 41a and 42a may be formed in a switch IC that is a single integrated circuit device. The switch IC may be provided with a terminal for connecting the inductor 58.

The filter 16 is a band pass filter whose pass band is a sixth frequency band. The sixth frequency band is located on a lower frequency side than any of the first, second, and third frequency bands that are the pass bands of the filters 11, 12, and 13, respectively. The sixth frequency band is, as an example, a frequency band of 1452 MHz to 1496 MHz in Band 32 defined by 3GPP. The filter 16 may be an acoustic wave filter.

One end of the filter 16 is connected to one end of the capacitor 42a, and the other end thereof is connected to the terminal P6.

The capacitor 42a is a capacitor whose capacitance value can be variably controlled, the other end of the capacitor 42a is connected to one end of the switch 36, and the other end of the switch 36 is connected to the connection point 21. The switch 36 switches between connection and disconnection between one end of the filter 16 and the connection point 21.

One end of the inductor 57 is connected to a signal path connecting one end of the filter 16 and one end of the capacitor 42a, and the other end thereof is connected to a ground electrode. One end of the inductor 58 is connected to the signal path connecting one end of the filter 16 and one end of the capacitor 42a, and the other end thereof is connected to one end of the switch 37. The other end of the switch 37 is connected to the connection point 21.

Here, the filter 16 is an example of a sixth filter. The switch 36 is an example of a sixth switch. The switch 37 is an example of a seventh switch. The capacitor 42a is an example of a second capacitor. The inductor 58 is an example of a third inductor.

Next, a usage example of the multiplexer 6 will be described. In the following description, Band 66, Band 3, Band 7, and Band 32 are an example of a band group that may be simultaneously used in carrier aggregation.

In a usage example 1, communication is performed by carrier aggregation in which one or both of Band 66 and Band 3, and Band 32 are simultaneously used.

In a usage example 2, communication is performed by carrier aggregation in which Band 7 and Band 32 are simultaneously used.

Figure 15A:
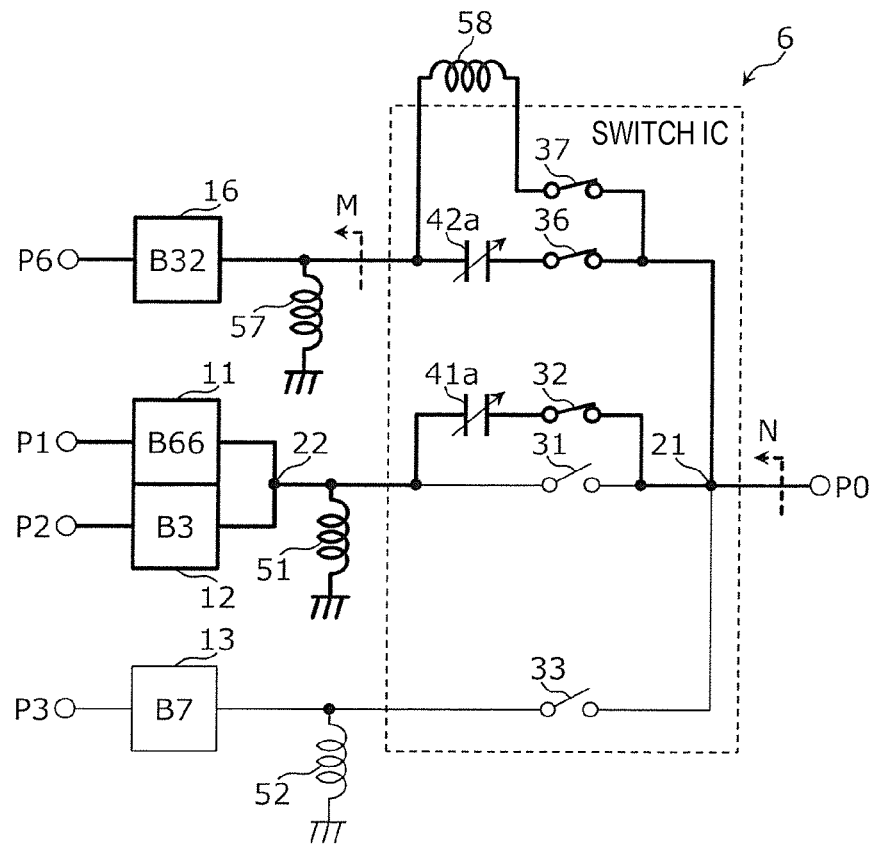
FIG. 15A is a circuit diagram illustrating a usage example of the multiplexer according to the sixth embodiment.

FIG. 15A is a circuit diagram illustrating a usage example 1 of the multiplexer 6. As illustrated in FIG. 15A, in the usage example 1 of the multiplexer 6, the switches 31 and 33 are in a disconnected state, and the switches 32, 36, and 37 are in a connected state. In FIG. 15A, circuit elements connected by the switches in the usage example 1 of the multiplexer 6 are indicated by bold lines.

Figure 15B:
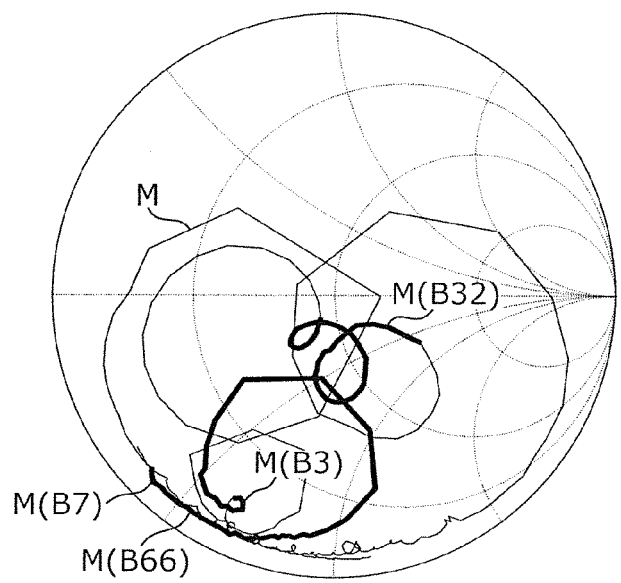
FIG. 15B is a Smith chart illustrating an example of an impedance when a filter side is seen from a point M in the usage example of the multiplexer according to the sixth embodiment.

FIG. 15B is a Smith chart illustrating an example of an impedance M when a filter 16 side is seen from a point M in the usage example 1 of the multiplexer 6. Positions M(B66), M(B3), and M(B7) of the impedances M in Band 66, Band 3, and Band 7 are on a short-circuit side. Therefore, when the point M is directly connected to the connection point 21, return losses in Band 66, Band 3, and Band 7 when a connection point 21 side is seen from a point N increase.

Therefore, in the usage example 1 of the multiplexer 6, the switches 36 and 37 are in a connected state, and a parallel resonance circuit is configured by using the capacitor 42a and the inductor 58. By setting a resonant frequency of the parallel resonance circuit to be within a frequency band including Band 3 and Band 66 by adjusting the capacitor 42a, the parallel resonance circuit is allowed to operate as a band elimination filter whose elimination band includes Band 3 and Band 66. This reduces the return losses in Band 66 and Band 3 when the connection point 21 side is seen from the point N.

Figure 15C:
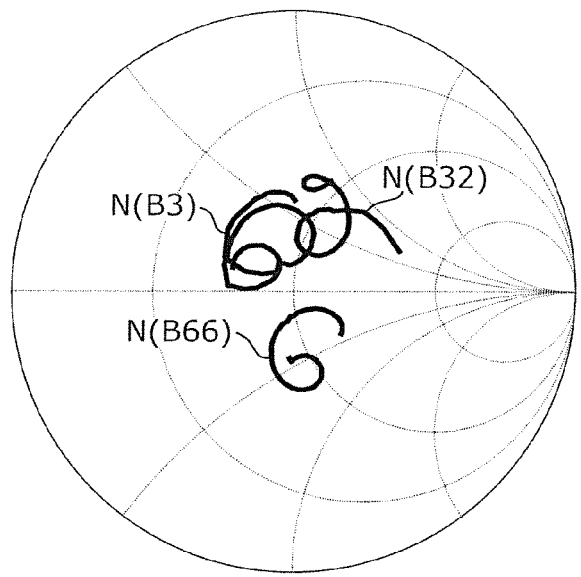
FIG. 15C is a Smith chart illustrating an example of an impedance when a filter side is seen from a point N in the usage example of the multiplexer according to the sixth embodiment.

FIG. 15C is a Smith chart illustrating an example of an impedance when the connection point 21 is seen from the point N in the usage example 1 of the multiplexer 6. It can be seen that positions N(B66), N(B3), and N(B7) of the impedance N in Band 66, Band 3, and Band 7 gather near the reference impedance, and matching is achieved.

Figure 15D:
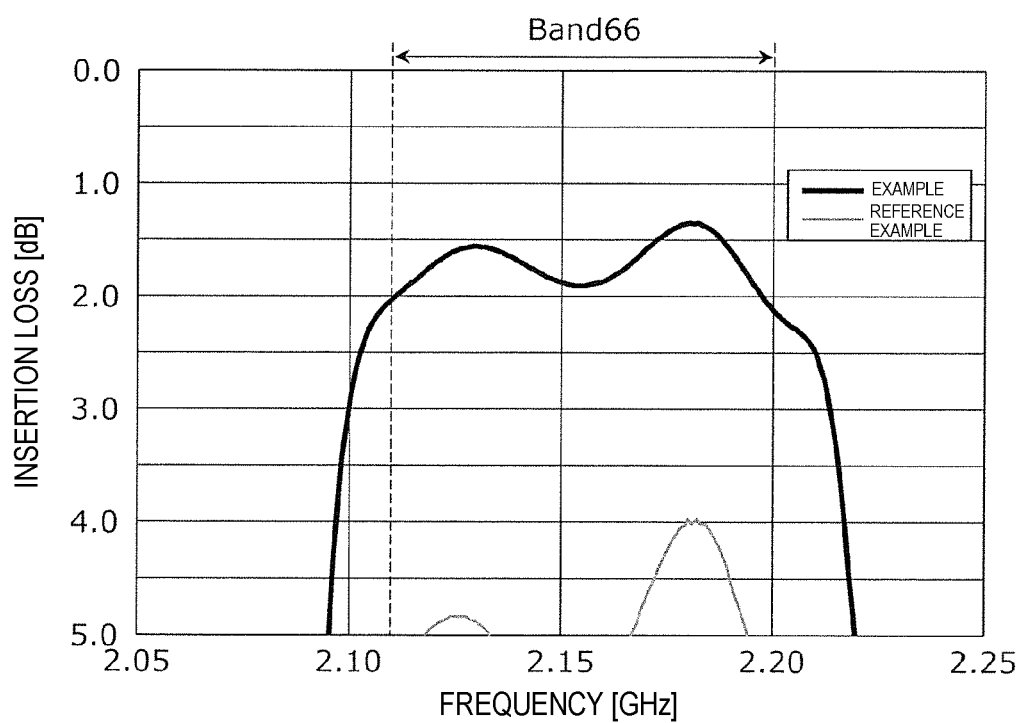
FIG. 15D is a graph illustrating an example of an insertion loss between the terminal P0 and the terminal P1 in the usage example of the multiplexer according to the sixth embodiment.

FIG. 15D is a graph illustrating an example of an insertion loss between the terminal P0 and the terminal P1 in the usage example 1 of the multiplexer 6 as an example. In FIG. 15D, for a purpose of comparison, an insertion loss between the terminal P0 and the terminal P1 in a hypothetical configuration in which the point M is directly connected to the connection point 21 is illustrated as a reference example.

Figure 15E:
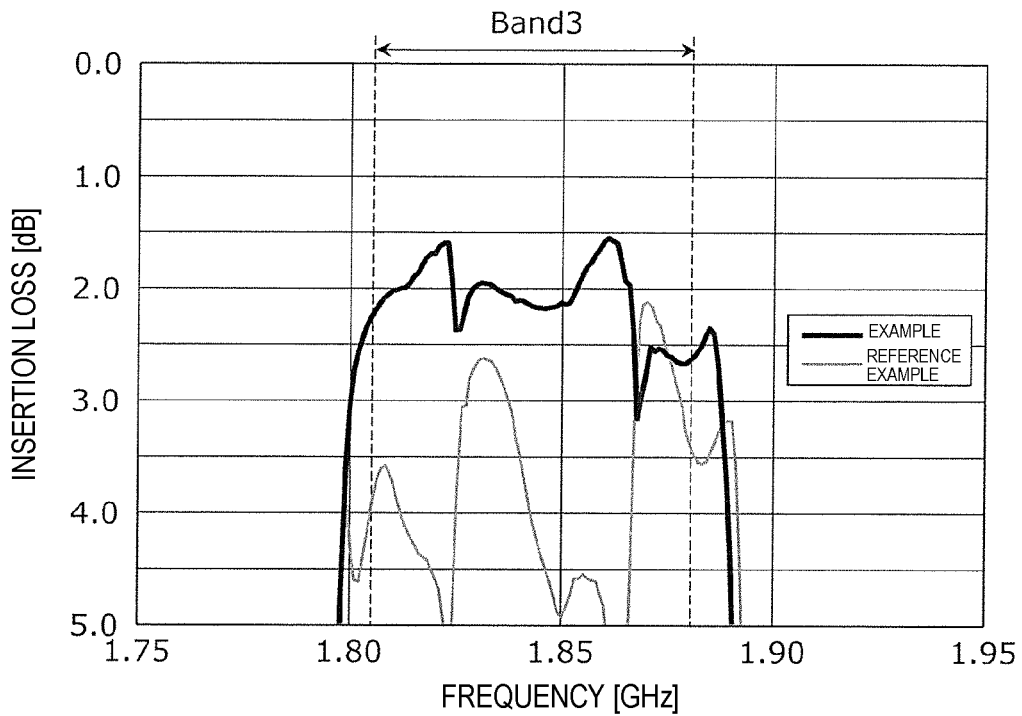
FIG. 15E is a graph illustrating an example of an insertion loss between the terminal P0 and the terminal P2 in the usage example of the multiplexer according to the sixth embodiment.

FIG. 15E is a graph illustrating an example of an insertion loss between the terminal P0 and the terminal P2 in the usage example 1 of the multiplexer 6 as an example. In FIG. 15E, for a purpose of comparison, an insertion loss between the terminal P0 and the terminal P2 in the hypothetical configuration in which the point M is directly connected to the connection point 21 is illustrated as a reference example.

As can be seen in FIG. 15D and FIG. 15E, the insertion losses between the terminal P0 and the terminal P1 and between the terminal P0 and the terminal P2 are relatively good in the example, but do not reach a practical level in the reference example.

Figure 15F:
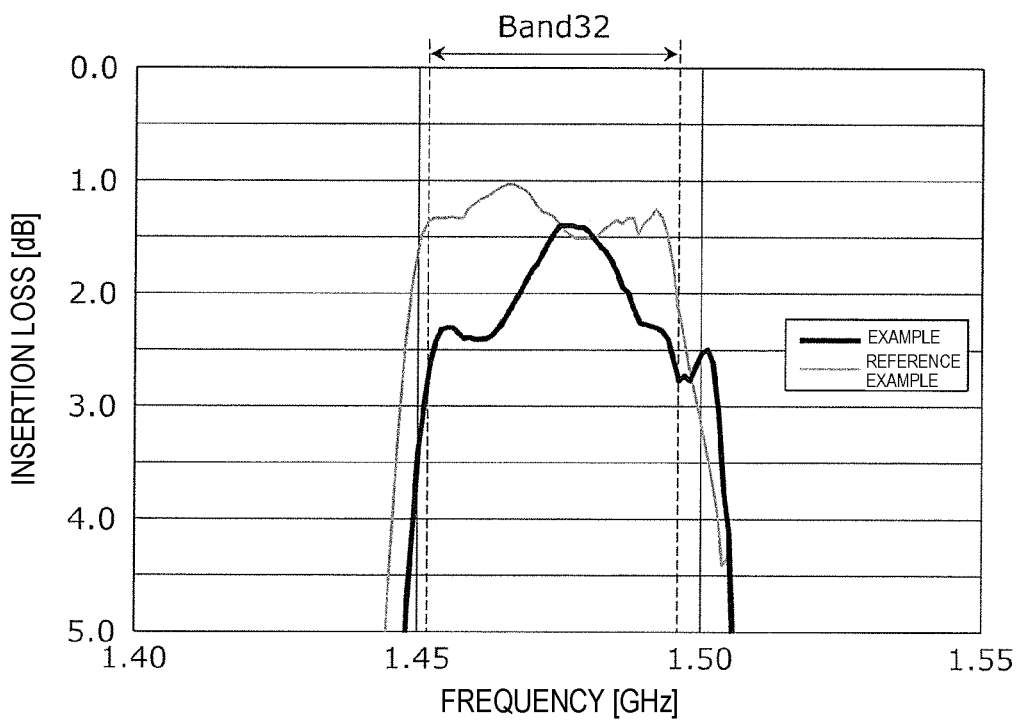
FIG. 15F is a graph illustrating an example of an insertion loss between the terminal P0 and a terminal P6 in the usage example of the multiplexer according to the sixth embodiment.

FIG. 15F is a graph illustrating an example of an insertion loss between the terminal P0 and the terminal P6 in the usage example 1 of the multiplexer 6 as an example. In FIG. 15F, for a purpose of comparison, an insertion loss between the terminal P0 and the terminal P6 in the hypothetical configuration in which the point M is directly connected to the connection point 21 is illustrated as a reference example.

As can be seen in FIG. 15F, the insertion loss between the terminal P0 and the terminal P6 is slightly increased in the example compared to the reference example, but reaches a practical level.

Figure 16A:
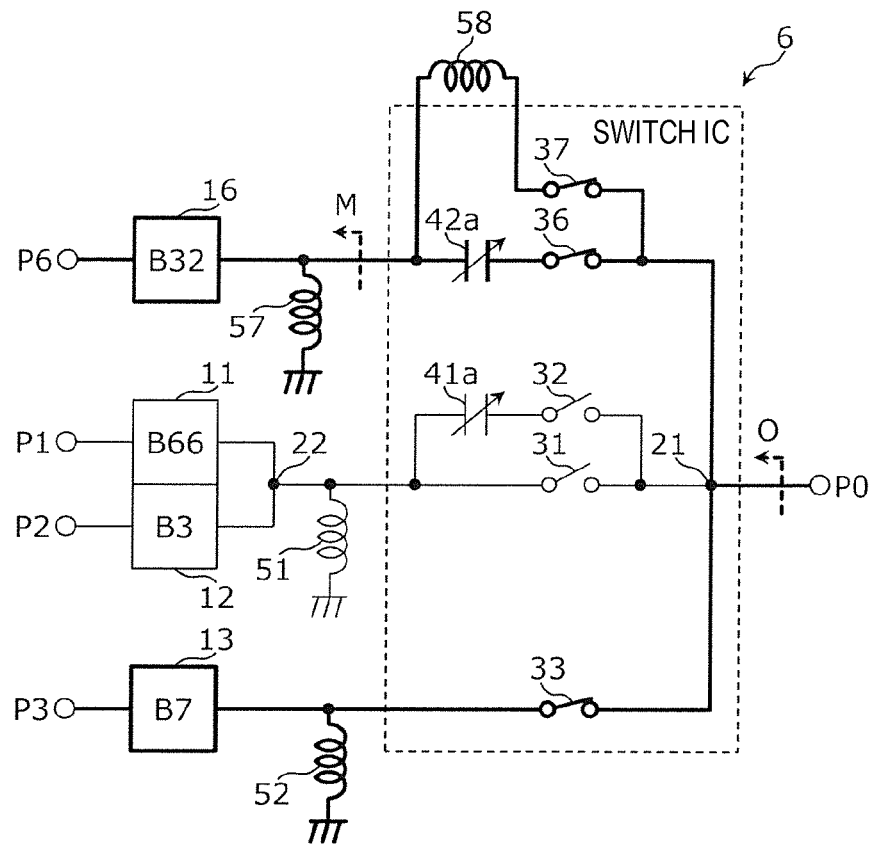
FIG. 16A is a circuit diagram illustrating a usage example of the multiplexer according to the sixth embodiment.

FIG. 16A is a circuit diagram illustrating the usage example 2 of the multiplexer 6. As illustrated in FIG. 16A, in the usage example 2 of the multiplexer 6, the switches 31 and 32 are in a disconnected state and the switches 33, 36, and 37 are in a connected state. In FIG. 16A, circuit elements connected by the switches in the usage example 2 of the multiplexer 6 are indicated by bold lines.

An impedance M when the filter 16 side is seen from the point M in the usage example 2 of the multiplexer 6 is the same as the impedance M of the Smith chart in FIG. 15B. Therefore, similarly to the usage example 1, the switches 36 and 37 are brought into the connected state, and the parallel resonance circuit is configured by using the capacitor 42a and the inductor 58. By setting a resonant frequency of the parallel resonance circuit to be within a frequency band including Band 7 by adjusting the capacitor 42a, the parallel resonance circuit is allowed to operate as a band elimination filter whose elimination band includes Band 7. This reduces a return loss in Band 7 when the connection point 21 side is seen from a point O.

Figure 16B:
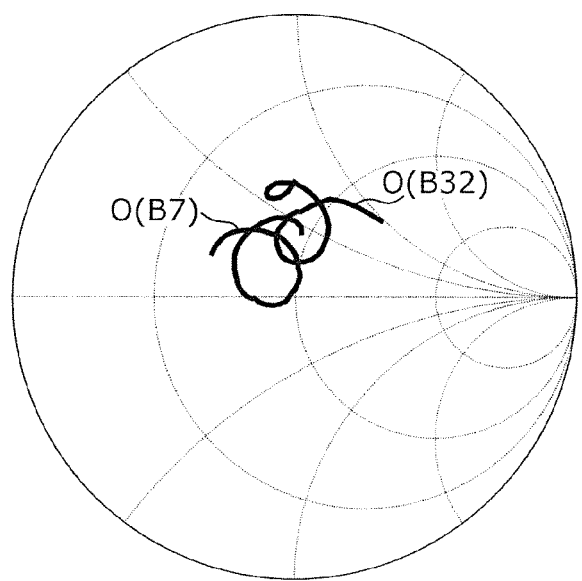
FIG. 16B is a Smith chart illustrating an example of an impedance when a filter side is seen from the point O in the usage example of the multiplexer according to the sixth embodiment.

FIG. 16B is a Smith chart illustrating an example of an impedance when the connection point 21 is seen from the point O in the usage example 2 of the multiplexer 6. It can be seen that positions N(B7) and N(B32) of an impedance N in Band 7 and Band 32 gather near the reference impedance and matching is achieved.

Figure 16C:
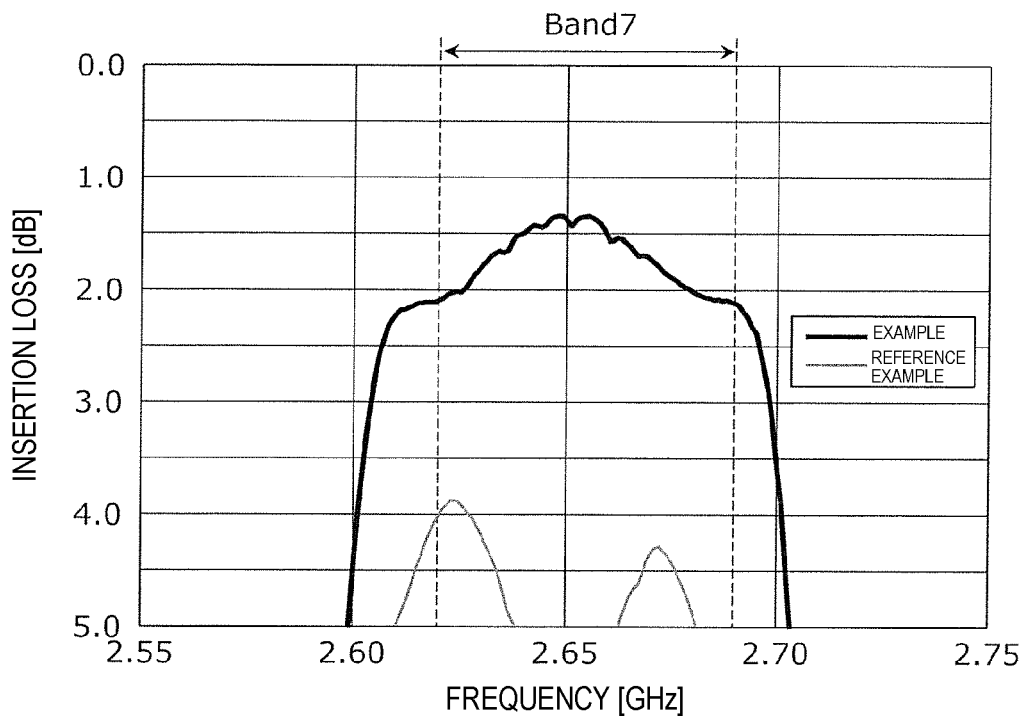
FIG. 16C is a graph illustrating an example of an insertion loss between the terminal P0 and the terminal P3 in the usage example of the multiplexer according to the sixth embodiment.

FIG. 16C is a graph illustrating an example of an insertion loss between the terminal P0 and the terminal P3 in the usage example 2 of the multiplexer 6 as an example. In FIG. 16C, for a purpose of comparison, an insertion loss between the terminal P0 and the terminal P3 in the hypothetical configuration in which the point M in the usage example 2 is directly connected to the connection point 21 is illustrated as a reference example.

Figure 16D:
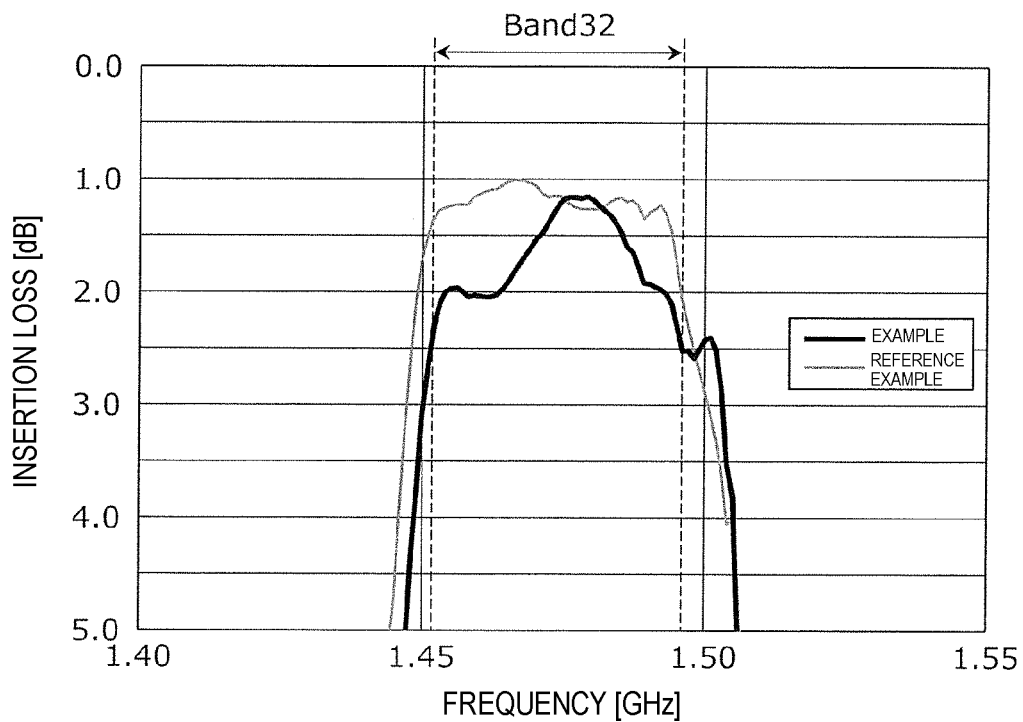
FIG. 16D is a graph illustrating an example of an insertion loss between the terminal P0 and the terminal P6 in the usage example of the multiplexer according to the sixth embodiment.

FIG. 16D is a graph illustrating an example of an insertion loss between the terminal P0 and the terminal P6 in the usage example 2 of the multiplexer 6 as an example. In FIG. 16D, for a purpose of comparison, an insertion loss between the terminal P0 and the terminal P6 in the hypothetical configuration in which the point M is directly connected to the connection point 21 is illustrated as a reference example.

As can be seen in FIG. 16D, the insertion loss between the terminal P0 and the terminal P6 is slightly increased in the example compared to the reference example, but reaches a practical level.

In this way, when a filter whose pass band is separated to a low frequency side is added, by adding a band elimination filter by using a parallel resonance circuit together with the filter, it is possible to effectively prevent an increase in return loss caused by the added filter.

Seventh Embodiment

In a seventh embodiment, another phase circuit for adjusting an impedance at the connection point 22 will be described.

In any of the above-described embodiments, as the phase circuit for adjusting the impedance at the connection point 22, the inductor 51 (so-called shunt inductor) connected between the ground electrode and the signal path connecting the connection point 22 and the switch 31 is exemplified.

For example, in the multiplexer 1 in FIG. 1, two filters 11 and 12 are connected to the connection point 22. The impedance at the connection point 22 is adjusted by using the inductor 51 such that, at the connection point 21, when the impedance at the connection point 22 is combined with an impedance when a filter 13 side is seen from the connection point 21, the combined impedance becomes the reference impedance. The inductor 51 is an example of a fourth inductor that is connected between the connection point 21 and the ground electrode when two filters are connected to the connection point 21.

In the adjustment of the impedance by the inductor 51 which is a shunt inductor, as the number of the filters connected to the connection point 22 increases, the impedance at the connection point 22 largely shifts to the capacitive side, and therefore, larger adjustment is required, and the loss caused by the adjustment increases.

Therefore, in the seventh embodiment, for example, when three or more filters are connected to the connection point 22, the adjustment of an impedance at the connection point 22 is performed by a series inductor instead of the shunt inductor. The series inductor refers to an inductor whose both ends are connected to a signal path.

Figure 17:
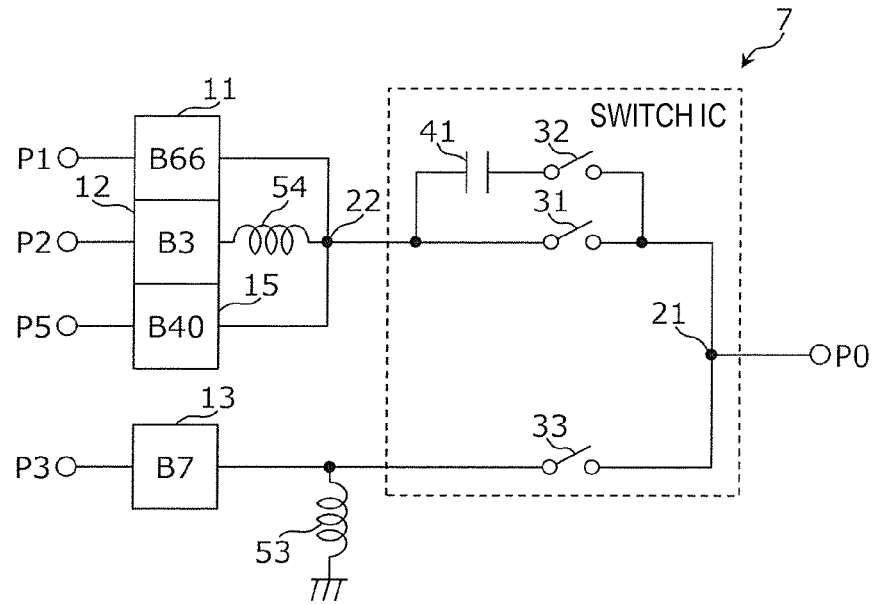
FIG. 17 is a circuit diagram illustrating an example of a configuration of a multiplexer according to a seventh embodiment.

FIG. 17 is a circuit diagram illustrating an example of a configuration of a multiplexer according to the seventh embodiment. A multiplexer 7 illustrated in FIG. 17 includes an inductor 54 instead of the inductor 51 as compared with the multiplexer 3 in FIG. 9A. The inductor 54 is an example of a fifth inductor.

The inductor 54 is connected between the connection point 22 and the filter 12 whose pass band is located at the lowest frequency side among the filters 11, 12, and 15 connected to the connection point 22. Thereby, it is possible to prevent a high-order unwanted wave that overlaps with a pass band of another filter.

When the impedance at the connection point 22 is adjusted by the shunt inductor, as the number of the filters connected to the connection point 22 increases, the impedance at the connection point 22 largely shifts to the capacitive side, and therefore, the larger adjustment is required, and the loss caused by the adjustment increases.

On the other hand, in the adjustment of an impedance by the inductor 54 which is a series inductor, a loss in a pass band of another filter increases as compared to the adjustment by the inductor 51. However, since one impedance among the filters connected to the connection point 22 is located on an inductive side, it is possible to suppress the shift of the impedance to the capacitive side in matching, and it is possible to allow the combined impedance to shift closer to the reference impedance with smaller adjustment.

Therefore, in a configuration in which two filters are connected to the connection point 22 (for example, the multiplexer 1 in FIG. 1), an impedance at the connection point 22 is adjusted by the inductor 51 which is a shunt inductor. In addition, in a configuration in which three or more filters are connected to the connection point 22 (for example, the multiplexer 7 in FIG. 17), an impedance at the connection point 22 is adjusted by the inductor 54 which is a series inductor.

Accordingly, the loss caused by the adjustment of the impedance is optimized, so that the multiplexer having excellent characteristics can be obtained.

Eighth Embodiment

In an eighth embodiment, a radio frequency front-end circuit including the multiplexer 1 described in the first embodiment and a communication device including the radio frequency front-end circuit will be described.

Figure 18:
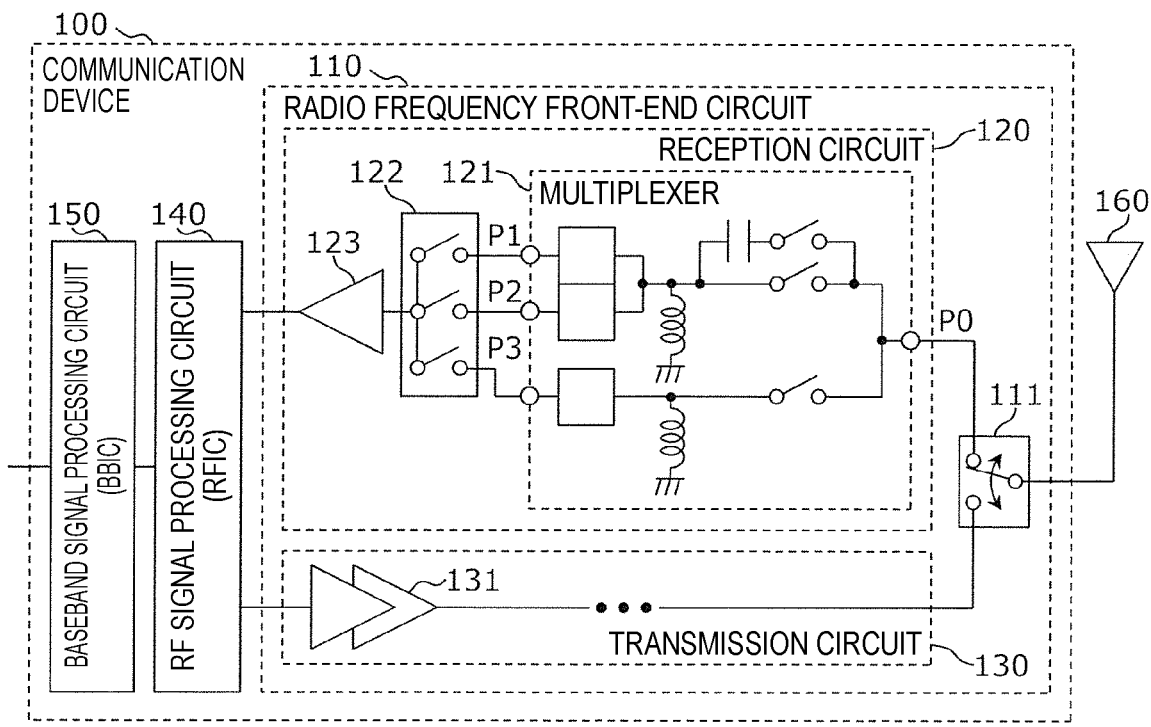
FIG. 18 is a block diagram illustrating an example of a functional configuration of a communication device according to an eighth embodiment.

FIG. 18 is a configuration diagram of a communication apparatus 100 according to the eighth embodiment. The communication device 100 includes a radio frequency front-end circuit 110, an RF signal processing circuit 140, and a baseband signal processing circuit 150. Note that, in FIG. 18, an antenna 160 connected to the communication device 100 is also illustrated.

The radio frequency front-end circuit 110 includes a switch 111, a reception circuit 120, and a transmission circuit 130.

The reception circuit 120 includes a multiplexer 121, a switch 122, and a low-noise amplifier 123.

The multiplexer 121 is, for example, the multiplexer 1 according to the first embodiment.

The switch 122 selectively connects one or more terminals among terminals P1, P2, and P3 of the multiplexer 121 to an input terminal of the low-noise amplifier 123 in accordance with a control signal (not illustrated). Accordingly, the radio frequency front-end circuit 110 can support carrier aggregation.

The low-noise amplifier 123 amplifies a radio frequency signal (here, a radio frequency reception signal) supplied from the antenna 160 with the switch 111, the multiplexer 121, and the switch 122 interposed therebetween, and outputs the amplified radio frequency signal to the RF signal processing circuit 140.

The transmission circuit 130 includes a power amplifier 131.

The power amplifier 131 amplifies the radio frequency signal (here, a radio frequency transmission signal) supplied from the RF signal processing circuit 140, and outputs the amplified radio frequency signal to the antenna 160 with the switch 111 interposed therebetween.

A multiplexer similar to that of the reception circuit 120 may be provided also in the transmission circuit 130 (not illustrated).

Note that the radio frequency front-end circuit 110 may include another circuit element between the above-described constituent elements.

The RF signal processing circuit 140 converts the radio frequency reception signal supplied from the radio frequency front-end circuit 110 into a reception signal, and supplies the reception signal to the baseband signal processing circuit 150. The conversion may include demodulation and down-conversion of the signal. The RF signal processing circuit 140 also converts a transmission signal generated by the baseband signal processing circuit 150 into a transmission RF signal, and supplies the transmission RF signal to the radio frequency front-end circuit 110. The conversion may include modulation and up-conversion of the signal. The RF signal processing circuit 140 may be configured with a radio frequency integrated circuit (RFIC) chip.

The baseband signal processing circuit 150 converts transmission data generated by an application device/application software (not illustrated) for performing a voice call, image display, and the like into a transmission signal, and supplies the transmission signal to the RF signal processing circuit 140. The conversion may include compressing the data, multiplexing the data, and adding an error correction code to the data. Further, the baseband signal processing circuit 150 converts the reception signal received from the RF signal processing circuit 140 into reception data and supplies the reception data to the application device/application software. The conversion may include decompressing the data, demultiplexing the data, and error correction of the data. The baseband signal processing circuit 150 may be configured with a baseband integrated circuit (BBIC) chip.

According to the radio frequency front-end circuit 110 and the communication device 100 configured as described above, it is possible to obtain the radio frequency front-end circuit 110 and the communication device 100 having a simple configuration and excellent characteristics by including the multiplexer 1 according to the first embodiment described above.

Note that the multiplexer 121 of the radio frequency front-end circuit 110 is not limited to the multiplexer 1 according to the first embodiment, and any of the multiplexers 2 to 7 described in the second to seventh embodiments may be used.

In addition, the communication device 100 may not include the baseband signal processing circuit 150 according to a processing scheme of a radio frequency signal.

Other Modifications, Etc.

The multiplexers 1 to 7 according to the first to seventh embodiments and the radio frequency front-end circuit 110 and the communication device 100 according to the eighth embodiment have been described above with reference to the embodiments, but the present disclosure is not limited to the above-described embodiments. For example, embodiments in which the following modifications are applied to the above-described embodiments may also be included in the present disclosure.

For example, the multiplexer according to the present disclosure is not limited to have a configuration including only a plurality of reception filters, and may have a configuration including only a plurality of transmission filters or a configuration including both a reception filter and a transmission filter.

According to the multiplexer, the radio frequency front-end circuit, and the communication device according to the present disclosure, it is possible to obtain a multiplexer having a simple configuration and excellent characteristics, and a radio frequency front-end circuit and a communication device that use such a multiplexer.

The present disclosure is widely applicable to a communication device such as a mobile phone as a low-loss multiplexer, radio frequency front-end circuit, communication unit, or the like that can conform to a frequency standard supporting multi-band and multi-mode communication.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A multiplexer comprising:
a first filter having a first pass band;
a second filter having a second pass band, the second pass band being different than the first pass band;
a third filter having a third pass band, the third pass band being different than any of the first pass band and the second pass band;
a first connection point connected to a common terminal;
a second connection point to which a first end of the first filter and a first end of the second filter are commonly connected;
a first switch configured to selectively connect the first connection point to the second connection point;
a reactance element having a first end that is connected to a signal path, the signal path connecting the second connection point and the first switch;
a second switch configured to selectively connect a second end of the reactance element to the first connection point; and
a third switch configured to selectively connect a first end of the third filter to the first connection point,
wherein the first pass band and the second pass band are adjacent to each other among the first pass band, the second pass band, and the third pass band.

2. The multiplexer according to claim 1, wherein the reactance element is a first capacitor.

3. The multiplexer according to claim 1, wherein the first switch, the second switch, the third switch, and the reactance element are part of a single integrated circuit.

4. The multiplexer according to claim 1, wherein:
in communication, the multiplexer is configured to pass a signal in any one or more of the first pass band, the second pass band, or the third pass band independently or simultaneously,
in a first state of the multiplexer, the first switch is in a connected state, and the second switch and the third switch are in a disconnected state,
in a second state of the multiplexer, the first switch and the second switch are in a disconnected state, and the third switch is in a connected state, and
in a third state of the multiplexer, the first switch is in a disconnected state, and the second switch and the third switch are in a connected state.

5. The multiplexer according to claim 1, further comprising:
a fourth filter having a fourth pass band, the fourth pass band being different than any of the first pass band, the second pass band, and the third pass band; and
a fourth switch configured to selectively connect a first end of the fourth filter to the first connection point,
wherein a reactance value of the reactance element is variably controllable.

6. The multiplexer according to claim 1, further comprising:
a fifth filter having a fifth pass band, the fifth pass band being different than any of the first pass band, the second pass band, and the third pass band,
wherein a first end of the fifth filter is connected to the second connection point.

7. The multiplexer according to claim 1, further comprising:
a first inductor having a first end that is connected to a ground electrode; and
a fifth switch configured to selectively connect a second end of the first inductor to the first connection point.

8. The multiplexer according to claim 1, further comprising:
a second inductor connected between the first connection point and the common terminal.

9. The multiplexer according to claim 1, further comprising:
a sixth filter having a sixth pass band, the sixth pass band being lower in frequency than any of the first pass band, the second pass band, and the third pass band;
a second capacitor having a first end that is connected to a first end of the sixth filter, and having a capacitance value that is variably controllable;
a sixth switch configured to selectively connect a second end of the second capacitor to the first connection point;
a third inductor having a first end that is connected to the first end of the sixth filter; and
a seventh switch configured to selectively connect a second end of the third inductor to the common terminal.

10. The multiplexer according to claim 1, wherein:
a predetermined number of filters included in the multiplexer are connected to the second connection point,
when two filters are connected to the second connection point, a fourth inductor is connected between the second connection point and a ground electrode, and
when three or more filters are connected to the second connection point, a fifth inductor is connected between the second connection point and a filter having the lowest pass band among the filters connected to the second connection point.

11. The multiplexer according to claim 1, wherein each of the first filter, the second filter, and the third filter is an acoustic wave filter.

12. A radio frequency front-end circuit comprising:
multiplexer according to claim 1; and
an amplifier circuit connected to the multiplexer.

13. A communication device comprising:
a radio frequency (RF) signal processing circuit configured to process radio frequency signals transmitted and received by an antenna; and
the radio frequency front-end circuit according to claim 12 configured to transmit the radio frequency signals between the antenna and the RF signal processing circuit.

14. The multiplexer according to claim 1, wherein the third filter is not connected to a variably controllable reactance element.

* * * * *